(12) United States Patent
Tsuchiya et al.

(10) Patent No.: US 7,932,295 B2
(45) Date of Patent: Apr. 26, 2011

(54) ORGANIC SILICA-BASED FILM, METHOD OF FORMING THE SAME, COMPOSITION FOR FORMING INSULATING FILM FOR SEMICONDUCTOR DEVICE, INTERCONNECT STRUCTURE, AND SEMICONDUCTOR DEVICE

(75) Inventors: Hajime Tsuchiya, Tokyo (JP); Hiromi Egawa, Tokyo (JP); Terukazu Kokubo, Tokyo (JP); Atsushi Shiota, Tokyo (JP)

(73) Assignee: JSR Corporation, Tokyo (JP)

( * ) Notice: Subject to any disclaimer, the term of this patent is extended or adjusted under 35 U.S.C. 154(b) by 466 days.

(21) Appl. No.: 12/135,594

(22) Filed: Jun. 9, 2008

(65) Prior Publication Data

US 2008/0246153 A1    Oct. 9, 2008

Related U.S. Application Data

(62) Division of application No. 11/176,622, filed on Jul. 8, 2005, now Pat. No. 7,399,715.

(30) Foreign Application Priority Data

Jul. 9, 2004  (JP) .................. 2004-203646
Aug. 27, 2004  (JP) .................. 2004-248578

(51) Int. Cl.
C01B 33/155    (2006.01)
C09K 3/00    (2006.01)
H01L 23/535    (2006.01)
H01L 23/538    (2006.01)

(52) U.S. Cl. ................ 516/55; 516/111; 252/183.11; 257/499

(58) Field of Classification Search .......... 257/499; 516/55, 111; 252/183.11
See application file for complete search history.

(56) References Cited

U.S. PATENT DOCUMENTS

| 6,042,994 | A | 3/2000 | Yang et al. |
| 6,204,201 | B1 | 3/2001 | Ross |
| 6,235,101 | B1 | 5/2001 | Kurosawa et al. |
| 6,383,913 | B1 | 5/2002 | Tsai et al. |
| 6,413,647 | B1 | 7/2002 | Hayashi et al. |
| 6,495,264 | B2 | 12/2002 | Hayashi et al. |
| 6,809,041 | B2 | 10/2004 | Interrante et al. |

(Continued)

FOREIGN PATENT DOCUMENTS

EP    0 353 583 A2    2/1990

(Continued)

OTHER PUBLICATIONS

James L. Hedrick, et al., "Templating Nanoporosity in Thin-Film Dielectric Insulators", Advanced Materials, vol. 10, No. 13, 1998, pp. 1049-1053.

(Continued)

*Primary Examiner* — Evan Pert
(74) *Attorney, Agent, or Firm* — Oblon, Spivak, McClelland, Maier & Neustadt, L.L.P.

(57) ABSTRACT

A method of forming an organic silica-based film, including: applying a composition for forming an insulating film for a semiconductor device, which is cured by using heat and ultraviolet radiation, to a substrate to form a coating; heating the coating; and applying heat and ultraviolet radiation to the coating to effect a curing treatment, wherein the composition includes organic silica sol having a carbon content of 11.8 to 16.7 mol %, and an organic solvent, the organic silica sol being a hydrolysis-condensation product produced by hydrolysis and condensation of a silane compound selected from compounds shown by the general formulae (1): $R^1Si(OR^2)_3$, (2): $Si(OR^3)_4$, (3): $(R^4)_2Si(OR^5)_2$, and (4): $R^6{}_b(R^7O)_{3-b}Si-(R^{10})_d-Si(OR^8)_{3-c}R^9{}_c$.

30 Claims, 1 Drawing Sheet

U.S. PATENT DOCUMENTS

| | | |
|---|---|---|
| 6,902,771 B2 | 6/2005 | Shiota et al. |
| 7,026,053 B2 | 4/2006 | Shiota et al. |
| 7,060,909 B2 | 6/2006 | Fukuyama |
| 7,128,976 B2 | 10/2006 | Hayashi et al. |
| 2003/0054115 A1 | 3/2003 | Albano et al. |
| 2003/0104225 A1 | 6/2003 | Shiota et al. |
| 2003/0157340 A1 | 8/2003 | Shiota et al. |
| 2004/0058090 A1 | 3/2004 | Waldfried et al. |
| 2004/0109950 A1 | 6/2004 | Adams et al. |
| 2005/0096415 A1 | 5/2005 | Akiyama et al. |
| 2005/0136687 A1 | 6/2005 | Lu et al. |

FOREIGN PATENT DOCUMENTS

| | | |
|---|---|---|
| EP | 0 353 583 A3 | 2/1990 |
| EP | 1 122 770 | 8/2001 |
| EP | 1 146 092 A2 | 10/2001 |
| EP | 1 146 092 A3 | 10/2001 |
| EP | 1 295 924 A2 | 3/2003 |
| EP | 1 295 924 A3 | 3/2003 |
| JP | 63-248710 | 10/1988 |
| JP | 63-289939 | 11/1988 |
| JP | 1-194980 | 8/1989 |
| JP | 3-30427 | 2/1991 |
| JP | 8-29932 | 3/1996 |
| JP | 2000-109695 | 4/2000 |
| JP | 2000-290590 | 10/2000 |
| JP | 2000-313612 | 11/2000 |
| JP | 2001-110802 | 4/2001 |
| JP | 2002-288268 | 10/2002 |
| JP | 2003/031566 | 1/2003 |
| JP | 2004-59737 | 2/2004 |
| JP | 2004-149714 | 5/2004 |
| TW | 548236 | 8/2003 |
| WO | WO 03/025994 A1 | 3/2003 |

OTHER PUBLICATIONS

H. Miyajima, et al., "The Application of Simultaneous eBeam Cure Method for 65 nm node Cu/Low-k, Technology with Hybrd PAE/MSX) Structure", pp. 222-224, 2004.

Ed Mickler, et al., "A Charge Damage Study Using a Electron Beam Low k Treatment", pp. 190-192, 2004.

"Starfire® SP-DMPCS", Starfire® Systems, www.starfiresystems.com, May 2005, p. 1.

"Specialty Chemicals", Starfire Systems, (1), p. 1.

"Specialty Chemicals", Starfire Systems, (2), p. 1.

"Internet Archive WayBack Machine", http://web.archive.org/web/*/http://www.starfiresystems.com, p. 1.

"Starfire Systems: Projects, Specialty Chemicals", http://web.archive.org/web/20011205120755/www.starfiresystems.com/projects/chemicals.html, p. 1-2.

"Starfire® SP-DEPCS", Starfire® Systems, www.starfiresystems.com, May 2005, p. 1.

U.S. Appl. No. 12/717,225, filed Mar. 4, 2010, Akiyama, et al.

U.S. Appl. No. 12/749,735, filed Mar. 30, 2010, Nobe, et al.

Atsushi Yokotani, et al., "A single precursor photolitic chemical vapor deposition of silica film using a dielectric barier discharge xenon excimer lamp", Applied Physics Letters, AIP, American Institute of Physics, vol. 69, No. 10., XP12016011A, Sep. 2, 1996, pp. 1399-1401.

(1)

ORGANIC SILICA-BASED FILM, METHOD OF FORMING THE SAME, COMPOSITION FOR FORMING INSULATING FILM FOR SEMICONDUCTOR DEVICE, INTERCONNECT STRUCTURE, AND SEMICONDUCTOR DEVICE

CROSS-REFERENCE TO RELATED APPLICATIONS

The present application is a divisional of U.S. patent application Ser. No. 11/176,622, filed on Jul. 8, 2005, which claims priority to Japanese Patent Application JP 2004-203646, filed on Jul. 9, 2004, and Japanese Patent Application JP 2004-248578, filed on Aug. 27, 2004, which are hereby incorporated by reference in their entirety.

BACKGROUND OF THE INVENTION

The present invention relates to an organic silica-based film, a method of forming the same, a composition for forming an insulating film for a semiconductor device, an interconnect structure, and a semiconductor device.

A silica ($SiO_2$) film formed by a vacuum process such as a CVD process has been widely used as an interlayer dielectric for a semiconductor device used in a large-scale integrated circuit (LSI) or the like. In recent years, in order to form an interlayer dielectric having a more uniform thickness, a spin-on-glass (SOG) film, which is a coating-type insulating film containing an alkoxysilane hydrolysate as the major component, has also been used. Along with an increase in the degree of integration of the LSI, a low-relative-dielectric-constant interlayer dielectric containing organic silica sol represented by methyl silsesquioxane (MSQ) has also been developed (U.S. Pat. No. 6,235,101, U.S. Pat. No. 6,413,647, and U.S. Pat. No. 6,495,264).

The organic silica sol is cured by causing the silanol group in the sol to undergo a dehydration-condensation reaction by heating at 350 to 500° C., whereby an insulating film exhibiting a dielectric constant, mechanical strength, and chemical durability suitable as an interlayer dielectric for a semiconductor device can be formed. However, since the reaction of the organic silica sol is a solid-phase reaction, dehydration-condensation does not rapidly proceed due to diffusion control. Therefore, it is necessary to heat the organic silica sol for a long time (e.g. 30 minutes at least; usually one hour or more). In order to perform such a long heat treatment, a batch-type heat treatment furnace capable of treating 50 to 150 wafers at a time has been used to treat a spin-on low-dielectric-constant interlayer dielectric. A semiconductor device which mainly requires a low-dielectric-constant interlayer dielectric is a semiconductor device in the logic device field. However, a logic device interconnect manufacturing step has been tending toward a single-wafer process in which a wafer is rapidly processed one by one. This is because a mainstream logic device such as an ASIC or a custom IC is manufactured in a high-variety low-volume production process. Specifically, the single-wafer process has become the mainstream manufacturing process in order to improve the degrees of freedom of the manufacturing steps.

As a method for rapidly curing a low-dielectric-constant interlayer dielectric composition containing organic silica sol as the major component while improving the strength, a method using electron beams has been proposed (U.S. Pat. No. 6,204,201 and European Patent No. 1122770). This method causes not only a silanol condensation reaction, but also causes decomposition and activation of an organic group in the organic silica-based film to introduce a crosslinked structure such as $Si-CH_x-Si$. A film exhibiting low hygroscopicity and excellent mechanical strength can be obtained by applying electron beams usually within five minutes, whereby the single-wafer processing can be performed. On the other hand, accumulation of electric charge due to electron beam application may damage the transistor structure in the LSI. Therefore, arguments exist for and against curing a low-dielectric-constant interlayer dielectric composition using electron beams (E. Mickler et al. Proceedings of the International Interconnect Technology Conference, p. 190, 2004, Miyajima, et al. Proceedings of the International Interconnect Technology Conference, p. 222, 2004).

A method using ultraviolet radiation is considered as a method for rapidly curing a low-dielectric-constant interlayer dielectric composition containing organic silica sol as the major component without using electron beams. Now, technologies other than the LSI interlayer dielectric technology are considered below. A technology of gelling silica sol by adding a photoacid generator or a photobase generator, which generates an acid or a base upon exposure to ultraviolet radiation, to silica sol and an alkoxysilane to promote a condensation reaction of a silanol and an alkoxide has been known as an optical sol-gel technology, and has been applied to formation of an optical waveguide or the like (e.g. Japanese Patent Application Laid-open No. 2000-109695). A silica film cured by using a photoacid generator or a photobase generator generally exhibits high hygroscopicity due to a large amount of residual silanol. As a result, the resulting film has a high dielectric constant. The hygroscopicity due to the residual silanol may be reduced by gelling the silica sol by applying ultraviolet radiation and heating the resulting product at about 250 to 500° C. for a predetermined time or more (usually 30 minutes or more). However, this process does not achieve an improvement over the above-described silica film thermal curing method. Moreover, a composition containing a photoacid generator or a photobase generator cannot satisfy the quality as an insulating film of an LSI semiconductor device for which high insulation reliability is demanded, since the photoacid generator, the photobase generator, or an acidic or basic substance generated by the photoacid generator or the photobase generator functions as a charge carrier to impair the insulating properties or causes an interconnect metal to deteriorate.

A siloxane compound is highly transparent to ultraviolet radiation, and has been vigorously studied as a backbone of an $F_2$ photoresist using ultraviolet radiation having a wavelength of 157 nm (e.g. Japanese Patent Application Laid-open No. 2002-288268). This technology uses a siloxane backbone, but is basically based on the principle of a chemically-amplified photoresist using a KrF or ArF light source. Specifically, a photoacid generator generates an acidic substance upon exposure to ultraviolet radiation, and a chemical bond cleaved by an acid produces a functional group, such as a carboxylic acid, which is readily dissolved in a basic developer. Therefore, this technology does not promote a crosslinking reaction of silica sol by ultraviolet radiation.

The surface of the organic silica-based film cured by applying heat, electron beams, or the like has high hydrophobicity. In order to decrease the surface hydrophobicity, ultraviolet radiation may be applied to the organic silica-based film (e.g. U.S. Pat. No. 6,383,913, Japanese Patent Application Laid-open No. 63-248710, Japanese Patent Application Laid-open No. 63-289939, Japanese Patent Publication No. 8-29932, Japanese Patent Application Laid-open No. 2001-110802). These technologies are characterized in that the surface of the organic silica-based film is oxidized by ozone produced by applying ultraviolet radiation in air so that the hydrophobic surface is changed into a hydrophilic surface having high reactivity, such as a silanol. This modification treatment is mainly performed in order to improve adhesion to a film deposited as the upper layer.

As described above, a technology of applying a polysiloxane resin solution or an organic silica sol solution to a substrate and applying ultraviolet radiation to the resulting film has been widely studied. However, only a limited number of documents have been reported relating to a technology which uses ultraviolet radiation for curing organic silica sol in order to form an interlayer dielectric for an LSI semiconductor device. Japanese Patent Application Laid-open No. 3-30427, Japanese Patent Application Laid-open No. 1-194980, International Patent Publication No. WO 03/025994, and US Patent Application No. 2004/0058090 disclose such limited related-art technologies.

Japanese Patent Application Laid-open No. 3-30427 discloses a technology in which a solution prepared by dissolving a tetraalkoxysilane (e.g. tetraethoxysilane: TEOS) in collodion is applied to a semiconductor substrate, and ultraviolet radiation is applied to the solution in a nitrogen atmosphere to obtain a silicon dioxide film at a low temperature. The feature of this technology is that highly volatile TEOS is fixed using the collodion, and decomposition of the collodion and dehydration and condensation of TEOS are promoted by applying ultraviolet radiation. Japanese Patent Application Laid-open No. 1-194980 discloses a technology in which an organosiloxane resin is applied to a substrate, ultraviolet radiation having a dominant wavelength of 254 nm is applied to the resin at a temperature of 200° C. or less to oxidize the surface of the organosiloxane film by ozone produced by ultraviolet radiation, and the oxidized film is heated at 400° C. or more, particularly about 900° C. to obtain a dense silicon dioxide film.

International Patent Publication No. WO 03/025994 and US Patent Application No. 2004/0058090 disclose a technology of curing hydrogenated silsesquioxane (HSQ) or MSQ by applying ultraviolet radiation. In this technology, ultraviolet radiation is applied to HSQ or HSQ/MSQ cocondensate in the presence of oxygen so that active oxygen (e.g. ozone) produced in the system promotes oxidation of Si—H in HSQ to form a silica film containing a large amount of $SiO_2$ bond. These references describe that this technology is also effective for curing MSQ in the presence of oxygen rather than the absence of oxygen. Therefore, it is estimated that the $SiO_2$ bond formed by active oxygen is the principal mechanism of the crosslinking reaction. The feature of this technology is the use of ultraviolet radiation, since it is impossible to form the $SiO_2$ bond in a short time using other curing methods. However, while a silica film formed according to this technology has a high modulus of elasticity and high hardness due to an increase in the amount of the $SiO_2$ bond, the moisture absorption and the dielectric constant are increased due to an increase in hydrophilicity of the film. A film having high hygroscopicity generally tends to be damaged by reactive ion etching (RIE) performed in the processing of an interlayer dielectric of a semiconductor device, and exhibits insufficient chemical resistance against a wet cleaning liquid. This tendency significantly occurs in a low-dielectric-constant interlayer dielectric having a porous structure with a relative dielectric constant k of 2.5 or less. Therefore, (a) an organic silica sol composition which does not include an ionic substance such as a photoacid generator, photobase generator, or photosensitizer, a charge carrier, or a corrosive compound generation source, and can be cured in a short time, (b) a method for curing an organic silica-based film which does not cause damage to a transistor structure and enables single-wafer processing, (c) an organic silica-based film which does not exhibit hygroscopicity and exhibits high hydrophobicity, and (d) an organic silica-based film which exhibits such mechanical strength that the organic silica-based film can withstand formation of a copper damascene structure, are demanded as a low-dielectric-constant interlayer dielectric for an LSI semiconductor device along with a method of forming the same.

An organic silica sol composition for a low-dielectric-constant insulating film used for a semiconductor device is generally designed so that the composition of the organic silica sol is controlled so that an organic silica film obtained by curing the composition by heating has a high modulus of elasticity, taking into consideration the yield in a step in which a dynamic stress occurs, such as chemical mechanical polishing (CMP) or packaging (e.g. U.S. Pat. No. 6,495,264). In more detail, the organic silica sol composition is designed so that the absolute crosslink density in the silica film is increased by increasing the amount of tetrafunctional silane compound (hereinafter may be called "component Q") in the organic silica sol to usually 40 mol % or more. The crosslink density is increased by increasing the amount of the component Q, whereby a film having a high modulus of elasticity and high hardness can be obtained. However, it is difficult to cause the crosslink site (silanol) of the component Q to completely react. If the amount of component Q is increased to a large extent, the amount of residual silanol is increased after thermal curing, whereby the resulting film exhibits hydrophilicity and high hygroscopicity. In order to compensate for this drawback, cocondensation with an alkoxysilane having a hydrophobic group such as a methyltrialkoxysilane is carried out using a basic catalyst (e.g. ammonia or tetraalkylhydroxyammonium) to produce a sol having a high degree of condensation to reduce the absolute amount of silanol in the sol (U.S. Pat. No. 6,413,647), or the sol having a high degree of condensation is subjected to an additional hydrophobic treatment (Japanese Patent Application Laid-open No. 2004-59737 and Japanese Patent Application Laid-open No. 2004-149714). However, since the organic silica sol containing a large amount of component Q has a low molecular chain mobility due to high crosslink density, the diffusion barrier during the solid-phase reaction is considerably high. The condensation reaction is not promoted even if the organic silica sol containing a large amount of component Q is cured at 400° C. while applying ultraviolet radiation within five minutes. Therefore, a curing time of 30 minutes or more is required for causing the organic silica sol to react.

SUMMARY

According to a first aspect of the invention, there is provided a method of forming an organic silica-based film, the method comprising:

applying a composition for forming an insulating film for a semiconductor device, which is cured by using heat and ultraviolet radiation, to a substrate to form a coating;

heating the coating; and applying heat and ultraviolet radiation to the coating to effect a curing treatment, wherein the composition includes organic silica sol having a carbon content of 11.8 to 16.7 mol %, and an organic solvent, the organic silica sol being a hydrolysis-condensation product produced by hydrolysis and condensation of a silane compound selected from compounds shown by the following general formulae (1) to (4), $$R^1Si(OR^2)_3 \quad (1)$$

wherein $R^1$ represents an alkyl group or an aryl group, and $R^2$ represents an alkyl group or an aryl group, $$Si(OR^3)_4 \quad (2)$$

wherein $R^3$ represents an alkyl group or an aryl group, $$(R^4)_2Si(OR^5)_2 \quad (3)$$

wherein $R^4$ represents an alkyl group or an aryl group, and $R^5$ represents an alkyl group or an aryl group, and $$R^6{}_b(R^7O)_{3-b}Si-(R^{10})_d-Si(OR^8)_{3-c}R^9{}_c \quad (4)$$

wherein $R^6$ to $R^9$ individually represent an alkyl group or an aryl group, b and c individually represent integers from 0 to 2, $R^{10}$ represents an oxygen atom, a phenylene group, or a group $-(CH_2)_m-$ (wherein m represents an integer from 1 to 6), and d represents 0 or 1.

According to a second aspect of the invention, there is provided an organic silica-based film having a relative dielectric constant of 1.5 to 3.5 and a film density of 0.7 to 1.3 g/cm³, the organic silica-based film being obtained by the above-described method of forming an organic silica-based film.

According to a third aspect of the invention, there is provided an interconnect structure, comprising the above-described organic silica-based film as an interlayer dielectric.

According to a fourth aspect of the invention, there is provided a semiconductor device, comprising the above-described interconnect structure.

According to a fifth aspect of the invention, there is provided a composition for forming an insulating film for a semiconductor device, which is used in the method of forming an organic silica-based film, wherein the composition includes organic silica sol having a carbon content of 11.8 to 16.7 mol %, and an organic solvent, and is cured by using heat and ultraviolet radiation, the organic silica sol being a hydrolysis-condensation product produced by hydrolysis and condensation of a silane compound selected from a group of the compounds shown by the general formulae (1) to (4).

DETAILED DESCRIPTION OF THE EMBODIMENT

Figure 1:
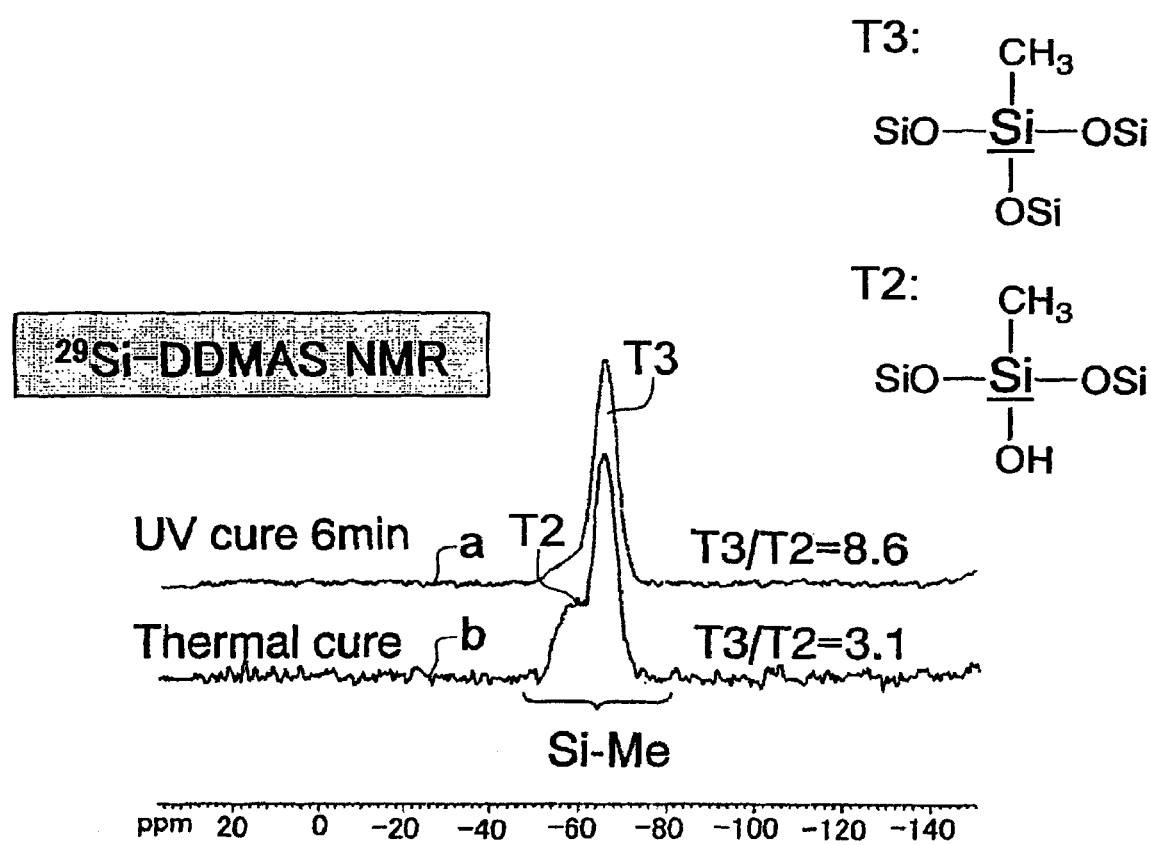
FIG. 1 is a diagram showing ²⁹Si-DDMAS NMR spectra determined for Example 7 and Comparative Example 3.

The invention may provide a method of forming an organic silica-based film capable of forming an organic silica-based film having a low relative dielectric constant, excellent mechanical strength, and high hydrophobicity in a short heating time using a composition for forming an insulating film for a semiconductor device which is cured by using heat and ultraviolet radiation, and may provide an organic silica-based film.

The invention may also provide a composition for forming an insulating film for a semiconductor device which may be suitably used in the manufacture of an LSI semiconductor device for which an increase in the degree of integration and an increase in the number of layers have been demanded, enables a reduction in heating time by application of ultraviolet radiation, and can form an insulating film having a low relative dielectric constant and excellent mechanical strength or the like.

The invention may further provide an interconnect structure including the organic silica-based film of the invention, and a semiconductor device including the interconnect structure.

According to one embodiment of the invention, there is provided a method of forming an organic silica-based film, the method comprising:

applying a composition for forming an insulating film for a semiconductor device, which is cured by using heat and ultraviolet radiation, to a substrate to form a coating;

heating the coating; and applying heat and ultraviolet radiation to the coating to effect a curing treatment, wherein the composition includes organic silica sol having a carbon content of 11.8 to 16.7 mol %, and an organic solvent, the organic silica sol being a hydrolysis-condensation product produced by hydrolysis and condensation of a silane compound selected from compounds shown by the following general formulae (1) to (4), $$R^1Si(OR^2)_3 \quad (1)$$

wherein $R^1$ represents an alkyl group or an aryl group, and $R^2$ represents an alkyl group or an aryl group, $$Si(OR^3)_4 \quad (2)$$

wherein $R^3$ represents an alkyl group or an aryl group, $$(R^4)_2Si(OR^5)_2 \quad (3)$$

wherein $R^4$ represents an alkyl group or an aryl group, and $R^5$ represents an alkyl group or an aryl group, and $$R^6{}_b(R^7O)_{3-b}Si-(R^{10})_d-Si(OR^8)_{3-c}R^9{}_c \quad (4)$$

wherein $R^6$ to $R^9$ individually represent an alkyl group or an aryl group, b and c individually represent integers from 0 to 2, $R^{10}$ represents an oxygen atom, a phenylene group, or a group $-(CH_2)_m-$ (wherein m represents an integer from 1 to 6), and d represents 0 or 1.

In this method of forming an organic silica-based film, the ultraviolet radiation may have a wavelength of 250 nm or less.

In this method of forming an organic silica-based film, the heat and the ultraviolet radiation may be applied at the same time.

In this method of forming an organic silica-based film, the heating may be performed at 300 to 450° C.

In this method of forming an organic silica-based film, the ultraviolet radiation may be applied in the absence of oxygen.

According to one embodiment of the invention, there is provided an organic silica-based film having a relative dielectric constant of 1.5 to 3.5 and a film density of 0.7 to 1.3 g/cm³, the organic silica-based film being obtained by the above method of forming an organic silica-based film.

According to one embodiment of the invention, there is provided an interconnect structure, comprising the above organic silica-based film as an interlayer dielectric.

According to one embodiment of the invention, there is provided a semiconductor device, comprising the above interconnect structure.

According to one embodiment of the invention, there is provided a composition for forming an insulating film for a semiconductor device, which is used in the above method of forming an organic silica-based film, wherein the composition includes organic silica sol having a carbon content of 11.8 to 16.7 mol %, and an organic solvent, and is cured by using heat and ultraviolet radiation, the organic silica sol being a hydrolysis-condensation product produced by hydrolysis and condensation of a silane compound selected from a group of the compounds shown by the general formulae (1) to (4).

In this composition for forming an insulating film for a semiconductor device, the content of the compounds shown by the general formula (1) in the group of the compounds may be 60 mol % or more.

In this composition for forming an insulating film for a semiconductor device, the content of the compounds shown by the general formula (2) in the group of the compounds may be 40 mol % or less.

In this composition for forming an insulating film for a semiconductor device, the group of the compounds may include the compounds shown by the general formula (1) in an amount of 65 to 95 mol % and the compounds shown by the general formula (2) in an amount of 5 to 35 mol %.

This composition for forming an insulating film for a semiconductor device may not include an ultraviolet radiation active reaction promoter. The reaction promoter may be one of, or a combination of, a reaction initiator, an acid generator, a base generator, and a sensitizer having a UV absorption function.

In this composition for forming an insulating film for a semiconductor device, the content of sodium, potassium, and iron may be respectively 100 ppb or less.

The composition for forming an insulating film (hereinafter simply called the film forming composition) having a low relative dielectric constant and excellent mechanical strength can be formed by applying organic silica sol composition having specific composition range to a substrate and drying the coating, before curing the coating by heating and applying ultraviolet radiation.

The above-described film forming composition and the method of forming an organic silica-based film will be described in detail below.

1. FILM FORMING COMPOSITION

A film forming composition according to one embodiment of the invention includes organic silica sol and an organic solvent, and the organic silica sol having a carbon content of 11.8 to 16.7 mol % and being a hydrolysis-condensation product produced by hydrolysis and condensation of a silane compound selected from compounds shown by the following general formula (1) (hereinafter may be called "component T"), compounds shown by the following general formula (2) (hereinafter may be called "component Q"), compounds shown by the following general formula (3) (hereinafter may be called "component D"), and compounds shown by the following general formula (4), the film forming composition being cured by using heat and ultraviolet radiation.

$$R^1Si(OR^2)_3 \quad (1)$$

wherein $R^1$ represents an alkyl group or an aryl group, and $R^2$ represents an alkyl group or an aryl group.

$$Si(OR^3)_4 \quad (2)$$

wherein $R^3$ represents an alkyl group or an aryl group.

$$(R^4)_2Si(OR^5)_2 \quad (3)$$

wherein $R^4$ represents an alkyl group or an aryl group, and $R^5$ represents an alkyl group or an aryl group.

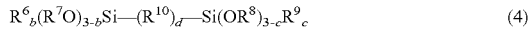

$$R^6{}_b(R^7O)_{3-b}Si-(R^{10})_d-Si(OR^8)_{3-c}R^9{}_c \quad (4)$$

wherein $R^6$ to $R^9$ individually represent an alkyl group or an aryl group, b and c individually represent integers from 0 to 2, $R^{10}$ represents an oxygen atom, a phenylene group, or a group $-(CH_2)_m-$ (wherein m represents an integer from 1 to 6), and d represents 0 or 1.

The silane compound, composition, organic solvent, additive, and the like are described below in detail.

1.1 Silane Compound

As the compound shown by the general formula (1) (hereinafter called "compound 1"), the compound shown by the general formula (2) (hereinafter called "compound 2"), the compound shown by the general formula (3) (hereinafter called "compound 3"), and the compound shown by the general formula (4) (hereinafter called "compound 4"), the following compounds may be used.

1.1.1 Compound 1

As the monovalent organic groups represented by $R^1$ and $R^2$ in the general formula (1), an alkyl group and an aryl group can be given. It is preferable that the monovalent organic group represented by $R^2$ in the general formula (1) be an alkyl group or a phenyl group. As examples of the alkyl group, a methyl group, an ethyl group, a propyl group, a butyl group, and the like can be given. The alkyl group preferably includes 1 to 5 carbon atoms. The alkyl group may be either linear or branched. A hydrogen atom in the alkyl group may be replaced by a fluorine atom or the like. As examples of the aryl group in the general formula (1), a phenyl group, a naphthyl group, a methylphenyl group, an ethylphenyl group, a chlorophenyl group, a bromophenyl group, a fluorophenyl group, and the like can be given.

As specific examples of the compound 1, methyltrimethoxysilane, methyltriethoxysilane, methyltri-n-propoxysilane, methyltriisopropoxysilane, methyltri-n-butoxysilane, methyltri-sec-butoxysilane, methyltri-t-butoxysilane, methyltriphenoxysilane, ethyltrimethoxysilane, ethyltriethoxysilane, ethyltri-n-propoxysilane, ethyltriisopropoxysilane, ethyltri-n-butoxysilane, ethyltri-sec-butoxysilane, ethyltri-t-butoxysilane, ethyltriphenoxysilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-t-butoxysilane, n-propyltriphenoxysilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-t-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-t-butoxysilane, n-butyltriphenoxysilane, sec-butyltrimethoxysilane, sec-butyliso-triethoxysilane, sec-butyltri-n-propoxysilane, sec-butyltriisopropoxysilane, sec-butyltri-n-butoxysilane, sec-butyltri-sec-butoxysilane, sec-butyltri-t-butoxysilane, sec-butyltriphenoxysilane, t-butyltrimethoxysilane, t-butyltriethoxysilane, t-butyltri-n-propoxysilane, t-butyltriisopropoxysilane, t-butyltri-n-butoxysilane, t-butyltri-sec-butoxysilane, t-butyltri-t-butoxysilane, t-butyltriphenoxysilane, phenyltrimethoxysilane, phenyltriethoxysilane, phenyltri-n-propoxysilane, phenyltriisopropoxysilane, phenyltri-n-butoxysilane, phenyltri-sec-butoxysilane, phenyltri-t-butoxysilane, and phenyltriphenoxysilane can be given. These compounds may be used either individually or in combination of two or more.

As the compound 1, methyltrimethoxysilane, methyltriethoxysilane, methyltri-n-propoxysilane, methyltri-iso-propoxysilane, ethyltrimethoxysilane, ethyltriethoxysilane, phenyltrimethoxysilane, phenyltriethoxysilane, and the like are particularly preferable.

1.1.2 Compound 2

As examples of the monovalent organic group represented by $R^3$ in the general formula (2), the groups illustrated as the groups $R^1$ and $R^2$ in the general formula (1) can be given.

As specific examples of the compound 2, tetramethoxysilane, tetraethoxysilane, tetra-n-propoxysilane, tetra-iso-propoxysilane, tetra-n-butoxysilane, tetra-sec-butoxysilane, tetra-t-butoxysilane, tetraphenoxysilane, and the like can be given. Of these, tetramethoxysilane and tetraethoxysilane are particularly preferable. These compounds may be used either individually or in combination of two or more.

1.1.3 Compound 3

As examples of $R^4$ and $R^5$ in the general formula (3), the groups illustrated as the groups $R^1$ and $R^2$ in the general formula (1) can be given.

As specific examples of the compound 3, dimethyldimethoxysilane, dimethyldiethoxysilane, dimethyldi-n-propoxysilane, dimethyldiisopropoxysilane, dimethyldi-n-butoxysilane, dimethyldi-sec-butoxysilane, dimethyldi-t-butoxysilane, dimethyldiphenoxysilane, diethyldimethoxysilane, diethyldiethoxysilane, diethyldi-n-propoxysilane, diethyldiisopropoxysilane, diethyldi-n-butoxysilane, diethyldi-sec-butoxysilane, diethyldi-t-butoxysilane, diethyldiphenoxysilane, di-n-propyldimethoxysilane, di-n-propyldiethoxysilane, di-n-propyldi-n-propoxysilane, di-n-propyldiisopropoxysilane, di-n-propyldi-n-butoxysilane, di-n-propyldi-sec-butoxysilane, di-n-propyldi-t-butoxysilane, di-n-propyldi-phenoxysilane, diisopropyldimethoxysilane, diisopropyldiethoxysilane, diisopropyldi-n-propoxysilane, diisopropyldiisopropoxysilane, diisopropyldi-n-butoxysilane, diisopropyldi-sec-butoxysilane, diisopropyldi-t-butoxysilane, diisopropyldiphenoxysilane, di-n-butyldimethoxysilane, di-n-butyldiethoxysilane, di-n-butyldi-n-propoxysilane, di-n-butyldiisopropoxysilane, di-n-butyldi-n-butoxysilane, di-n-butyldi-sec-butoxysilane, di-n-butyldi-t-butoxysilane, di-n-butyldiphenoxysilane, di-sec-butyldimethoxysilane, di-sec-butyldiethoxysilane, di-sec-butyldi-n-propoxysilane, di-sec-butyldiisopropoxysilane, di-sec-butyldi-n-butoxysilane, di-sec-butyldi-sec-butoxysilane, di-sec-butyldi-t-butoxysilane, di-sec-butyldiphenoxysilane, di-t-butyldimethoxysilane, di-t-butyldiethoxysilane, di-t-butyldi-n-propoxysilane, di-t-butyldiisopropoxysilane, di-t-butyldi-n-butoxysilane, di-t-butyldi-sec-butoxysilane, di-t-butyldi-t-butoxysilane, di-t-butyldi-phenoxysilane, diphenyldimethoxysilane, diphenyldiethoxysilane, diphenyldi-n-propoxysilane, diphenyldiisopropoxysilane, diphenyldi-n-butoxysilane, diphenyldi-sec-butoxysilane, diphenyldi-t-butoxysilane, and diphenyldiphenoxysilane can be given.

Of these, dimethyldimethoxysilane, dimethyldiethoxysilane, diethyldimethoxysilane, diethyldiethoxysilane, diphenyldimethoxysilane, diphenyldiethoxysilane, and the like are preferable as the compound 3. These compounds may be used either individually or in combination of two or more.

1.1.4 Compound 4

As examples of $R^6$ to $R^9$ in the general formula (4), the groups illustrated as the groups $R^1$ and $R^2$ in the general formula (1) can be given.

As examples of the compounds shown by the general formula (4) in which d is 0, hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenyldisilane, 1,1,2,2-tetraethoxy-1,2-diphenyldisilane, 1,1,2,2-tetraphenoxy-1,2-diphenyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy-1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane, 1,1,2-triphenoxy-1,2,2-triphenyldisilane, 1,2-dimethoxy-1,1,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane, 1,2-diphenoxy-1,1,2,2-tetraphenyldisilane, and the like can be given.

Of these, hexamethoxydisilane, hexaethoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, 1,2-diethoxy-1,1,2,2-tetraphenyldisilane, and the like are preferable.

As examples of the compounds shown by the general formula (4) in which d is 1, bis(trimethoxysilyl)methane, bis(triethoxysilyl)methane, bis(tri-n-propoxysilyl)methane, bis(tri-1-propoxysilyl)methane, bis(tri-n-butoxysilyl)methane, bis(tri-sec-butoxysilyl)methane, bis(tri-t-butoxysilyl)methane, 1,2-bis(trimethoxysilyl)ethane, 1,2-bis(triethoxysilyl)ethane, 1,2-bis(tri-n-propoxysilyl)ethane, 1,2-bis(tri-i-propoxysilyl)ethane, 1,2-bis(tri-n-butoxysilyl)ethane, 1,2-bis(tri-sec-butoxysilyl)ethane, 1,2-bis(tri-t-butoxysilyl)ethane, 1-(dimethoxymethylsilyl)-1-(trimethoxysilyl)methane, 1-(diethoxymethylsilyl)-1-(triethoxysilyl)methane, 1-(di-n-propoxymethylsilyl)-1-(tri-n-propoxysilyl)methane, 1-(di-1-propoxymethylsilyl)-1-(tri-1-propoxysilyl)methane, 1-(di-n-butoxymethylsilyl)-1-(tri-n-butoxysilyl)methane, 1-(di-sec-butoxymethylsilyl)-1-(tri-sec-butoxysilyl)methane, 1-(di-t-butoxymethylsilyl)-1-(tri-t-butoxysilyl)methane, 1-(dimethoxymethylsilyl)-2-(trimethoxysilyl)ethane, 1-(diethoxymethylsilyl)-2-(triethoxysilyl)ethane, 1-(di-n-propoxymethylsilyl)-2-(tri-n-propoxysilyl)ethane, 1-(di-i-propoxymethylsilyl)-2-(tri-i-propoxysilyl)ethane, 1-(di-n-butoxymethylsilyl)-2-(tri-n-butoxysilyl)ethane, 1-(di-sec-butoxymethylsilyl)-2-(tri-sec-butoxysilyl)ethane, 1-(di-t-butoxymethylsilyl)-2-(tri-t-butoxysilyl)ethane, bis(dimethoxymethylsilyl)methane, bis(diethoxymethylsilyl)methane, bis(di-n-propoxymethylsilyl)methane, bis(di-i-propoxymethylsilyl)methane, bis(di-n-butoxymethylsilyl)methane, bis(di-sec-butoxymethylsilyl)methane, bis(di-t-butoxymethylsilyl)methane, 1,2-bis(dimethoxymethylsilyl)ethane, 1,2-bis(diethoxymethylsilyl)ethane, 1,2-bis(di-n-propoxymethylsilyl)ethane, 1,2-bis(di-i- propoxymethylsilyl)ethane, 1,2-bis(di-n-butoxymethylsilyl) ethane, 1,2-bis(di-sec-butoxymethylsilyl)ethane, 1,2-bis(di-t-butoxymethylsilyl)ethane, 1,2-bis(trimethoxysilyl) benzene, 1,2-bis(triethoxysilyl)benzene, 1,2-bis(tri-n-propoxysilyl)benzene, 1,2-bis(tri-i-propoxysilyl)benzene, 1,2-bis(tri-n-butoxysilyl)benzene, 1,2-bis(tri-sec-butoxysilyl)benzene, 1,2-bis(tri-t-butoxysilyl)benzene, 1,3-bis(trimethoxysilyl)benzene, 1,3-bis(triethoxysilyl)benzene, 1,3-bis(tri-n-propoxysilyl)benzene, 1,3-bis(tri-i-propoxysilyl) benzene, 1,3-bis(tri-n-butoxysilyl)benzene, 1,3-bis(tri-sec-butoxysilyl)benzene, 1,3-bis(tri-t-butoxysilyl)benzene, 1,4-bis(trimethoxysilyl)benzene, 1,4-bis(triethoxysilyl)benzene, 1,4-bis(tri-n-propoxysilyl)benzene, 1,4-bis(tri-i-propoxysilyl)benzene, 1,4-bis(tri-n-butoxysilyl)benzene, 1,4-bis(tri-sec-butoxysilyl)benzene, 1,4-bis(tri-t-butoxysilyl)benzene, and the like can be given.

Of these, bis(trimethoxysilyl)methane, bis(triethoxysilyl) methane, 1,2-bis(trimethoxysilyl)ethane, 1,2-bis(triethoxysilyl)ethane, 1-(dimethoxymethylsilyl)-1-(trimethoxysilyl) methane, 1-(diethoxymethylsilyl)-1-(triethoxysilyl) methane, 1-(dimethoxymethylsilyl)-2-(trimethoxysilyl) ethane, 1-(diethoxymethylsilyl)-2-(triethoxysilyl)ethane, bis (dimethoxymethylsilyl)methane, bis(diethoxymethylsilyl) methane, 1,2-bis(dimethoxymethylsilyl)ethane, 1,2-bis (diethoxymethylsilyl)ethane, 1,2-bis(trimethoxysilyl) benzene, 1,2-bis(triethoxysilyl)benzene, 1,3-bis (trimethoxysilyl)benzene, 1,3-bis(triethoxysilyl)benzene, 1,4-bis(trimethoxysilyl)benzene, 1,4-bis(triethoxysilyl)benzene, and the like are preferable.

The compound 4 may be used either individually or in combination of two or more.

1.1.5 Composition of Silane Compound

The carbon content of the organic silica sol in the film forming composition according to the embodiment is 11.8 to 16.7 mol %. If the carbon content is lower than 11.8 mol %, since the diffusion barrier in the solid-phase reaction is increased, the reaction is promoted to only a small extent even if ultraviolet radiation is applied. If the carbon content is higher than 16.7 mol %, the molecular mobility is excessively increased, whereby the modulus of elasticity of the resulting film is decreased. In some cases, the film may show a glass transition temperature.

In the film forming composition according to the embodiment, the content of the compound 1 shown by the general formula (1) is preferably 60 mol % or more, and still more preferably 65 to 95 mol % of the silane compound. The content of the compound 2 shown by the general formula (2) is preferably 40 mol % or less, and still more preferably 5 to 35 mol % of the silane compound. The film forming composition according to the embodiment includes at least the compound 1 and the compound 2.

The film forming composition according to the embodiment may include the compound 3 shown by the general formula (3) and the compound 4 shown by the general formula (4), as required. It is preferable that the content of the compounds 3 and 4 be 35 mol % or less of the entire silane compound. If the content of the compounds 3 and 4 exceeds 35 mol %, it is extremely difficult to control the molecular weight of the organic silica sol when obtaining the film forming composition. In some cases, gelation may occur.

The molecular weight of the organic silica sol in the film forming composition according to the embodiment may be 500 to 500,000. If the molecular weight is greater than this range, particles tend to be formed. Moreover, the size of the pore in the organic silica film is increased to a large extent. If the molecular weight is smaller than this range, problems may occur relating to applicability and storage stability.

The film forming composition according to the embodiment may not include a reaction promoter for promoting the hydrolysis reaction and/or the condensation reaction of the silane compound. The reaction promoter used herein refers to one of, or a combination of, a reaction initiator, a catalyst (acid generator or base generator), and a sensitizer having a UV absorption function. As described above, a silica film cured by using an acid generator or a base generator generally exhibits high hygroscopicity due to high residual silanol content, whereby the resulting film has a high dielectric constant. Moreover, a composition including an acid generator or a base generator may not satisfy the quality of an insulating film for an LSI semiconductor device for which high insulation reliability is demanded, since the acid generator, the base generator, or an acidic or basic substance generated by the acid generator or the base generator functions as an electric charge carrier to impair the insulating properties of the film or cause an interconnect metal to deteriorate. Since the film forming composition according to the embodiment can be cured by heating and ultraviolet radiation application without using such a reaction promoter, occurrence of these problems can be prevented.

In the film forming composition according to the embodiment, it is preferable that the content of sodium, potassium, and iron be respectively 100 ppb or less. Since these elements contaminate a semiconductor device, it is preferable that these elements be removed as far as possible.

1.1.6 Method of Producing Film Forming Composition

The film forming composition according to the embodiment includes a hydrolysis-condensation product produced by hydrolysis and condensation of the above-described silane compounds 1 to 4. The hydrolysis and condensation of the silane compounds 1 to 4 may be carried out in the presence of a metal chelate compound, an acidic compound, or a basic compound. The metal chelate compound, the acidic compound, and the basic compound are described below.

1.1.6a Metal Chelate Compound

The metal chelate compound which may be used at the time of hydrolysis and condensation of the silane compounds 1 to 4 is shown by the following general formula (5).

$$R^{11}{}_\beta M(OR^{12})_{\alpha-\beta} \quad (5)$$

wherein $R^{11}$ represents a chelating agent, M represents a metal atom, $R^{12}$ represents an alkyl group having 2 to 5 carbon atoms or an aryl group having 6 to 20 carbon atoms, α represents the valence of the metal M, and β represents an integer from 1 to α.

As the metal M, at least one metal selected from the group IIIB metals (aluminum, gallium, indium, and thallium) and the group IVA metals (titanium, zirconium, and hafnium) is preferable, with titanium, aluminum, and zirconium being still more preferable.

As specific examples of the metal chelate compound, titanium chelate compounds such as triethoxy•mono(acetylacetonate)titanium, tri-n-propoxy•mono(acetylacetonate)titanium, tri-i-propoxy•mono(acetylacetonate)titanium, tri-n-butoxy•mono(acetylacetonate)titanium, tri-sec-butoxy•mono(acetylacetonate)titanium, tri-t-butoxy•mono (acetylacetonate)titanium, diethoxy•bis(acetylacetonate) titanium, di-n-propoxy•bis(acetylacetonate)titanium, di-i- propoxy•bis(acetylacetonate)titanium, di-n-butoxy•bis (acetylacetonate)titanium, di-sec-butoxy•bis(acetylacetonate)titanium, di-t-butoxy•bis(acetylacetonate)titanium, monoethoxy•tris(acetylacetonate)titanium, mono-n-propoxy•tris(acetylacetonate)titanium, mono-i-propoxy•tris (acetylacetonate)titanium, mono-n-butoxy•tris(acetylacetonate)titanium, mono-sec-butoxy•tris(acetylacetonate) titanium, mono-t-butoxy•tris(acetylacetonate)titanium, tetrakis(acetylacetonate)titanium, triethoxy•mono(ethylacetoacetate)titanium, tri-n-propoxy•mono(ethylacetoacetate) titanium, tri-i-propoxy•mono(ethylacetoacetate)titanium, tri-n-butoxy•mono(ethylacetoacetate)titanium, tri-sec-butoxy•mono(ethylacetoacetate)titanium, tri-t-butoxy•mono (ethylacetoacetate)titanium, diethoxy•bis(ethylacetoacetate) titanium, di-n-propoxy•bis(ethylacetoacetate)titanium, di-i-propoxy•bis(ethylacetoacetate)titanium, di-n-butoxy•bis (ethylacetoacetate)titanium, di-sec-butoxy•bis (ethylacetoacetate)titanium, di-t-butoxy•bis (ethylacetoacetate)titanium, monoethoxy•tris (ethylacetoacetate)titanium, mono-n-propoxy•tris (ethylacetoacetate)titanium, mono-i-propoxy•tris (ethylacetoacetate)titanium, mono-n-butoxy•tris (ethylacetoacetate)titanium, mono-sec-butoxy•tris (ethylacetoacetate)titanium, mono-t-butoxy•tris (ethylacetoacetate)titanium, tetrakis(ethylacetoacetate) titanium, mono(acetylacetonate)tris(ethylacetoacetate) titanium, bis(acetylacetonate)bis(ethylacetoacetate) titanium, and tris(acetylacetonate)mono(ethylacetoacetate) titanium; zirconium chelate compounds such as triethoxy•mono(acetylacetonate)zirconium, tri-n-propoxy•mono(acetylacetonate)zirconium, tri-i-propoxy•mono(acetylacetonate)zirconium, tri-n-butoxy•mono(acetylacetonate)zirconium, tri-sec-butoxy•mono(acetylacetonate)zirconium, tri-t-butoxy•mono (acetylacetonate)zirconium, diethoxy•bis(acetylacetonate) zirconium, di-n-propoxy•bis(acetylacetonate)zirconium, di-i-propoxy•bis(acetylacetonate)zirconium, di-n-butoxy•bis(acetylacetonate)zirconium, di-sec-butoxy•bis (acetylacetonate)zirconium, di-t-butoxy•bis(acetylacetonate)zirconium, monoethoxy•tris(acetylacetonate) zirconium, mono-n-propoxy•tris(acetylacetonate)zirconium, mono-i-propoxy•tris(acetylacetonate)zirconium, mono-n-butoxy•tris(acetylacetonate)zirconium, mono-sec-butoxy•tris(acetylacetonate)zirconium, mono-t-butoxy•tris (acetylacetonate)zirconium, tetrakis(acetylacetonate) zirconium, triethoxy•mono(ethylacetoacetate)zirconium, tri-n-propoxy•mono(ethylacetoacetate)zirconium, tri-i-propoxy•mono(ethylacetoacetate)zirconium, tri-n-butoxy•mono(ethylacetoacetate)zirconium, tri-sec-butoxy•mono(ethylacetoacetate)zirconium, tri-t-butoxy•mono(ethylacetoacetate)zirconium, diethoxy•bis (ethylacetoacetate)zirconium, di-n-propoxy•bis (ethylacetoacetate)zirconium, di-i-propoxy•bis (ethylacetoacetate)zirconium, di-n-butoxy•bis (ethylacetoacetate)zirconium, di-sec-butoxy•bis (ethylacetoacetate)zirconium, di-t-butoxy•bis (ethylacetoacetate)zirconium, monoethoxy•tris (ethylacetoacetate)zirconium, mono-n-propoxy•tris (ethylacetoacetate)zirconium, mono-i-propoxy•tris (ethylacetoacetate)zirconium, mono-n-butoxy•tris (ethylacetoacetate)zirconium, mono-sec-butoxy•tris (ethylacetoacetate)zirconium, mono-t-butoxy•tris (ethylacetoacetate)zirconium, tetrakis(ethylacetoacetate) zirconium, mono(acetylacetonate)tris(ethylacetoacetate) zirconium, bis(acetylacetonate)bis(ethylacetoacetate) zirconium, and tris(acetylacetonate)mono(ethylacetoacetate) zirconium; and aluminum chelate compounds such as triethoxy•mono(acetylacetonate)aluminum, tri-n-propoxy•mono(acetylacetonate)aluminum, tri-i-propoxy•mono(acetylacetonate)aluminum, tri-n-butoxy•mono(acetylacetonate)aluminum, tri-sec-butoxy•mono(acetylacetonate)aluminum, tri-t-butoxy•mono (acetylacetonate)aluminum, diethoxy•bis(acetylacetonate) aluminum, di-n-propoxy•bis(acetylacetonate)aluminum, di-i-propoxy•bis(acetylacetonate)aluminum, di-n-butoxy•bis(acetylacetonate)aluminum, di-sec-butoxy•bis (acetylacetonate)aluminum, di-t-butoxy•bis(acetylacetonate)aluminum, monoethoxy•tris(acetylacetonate) aluminum, mono-n-propoxy•tris(acetylacetonate)aluminum, mono-i-propoxy•tris(acetylacetonate)aluminum, mono-n-butoxy•tris(acetylacetonate)aluminum, mono-sec-butoxy•tris(acetylacetonate)aluminum, mono-t-butoxy•tris (acetylacetonate)aluminum, tetrakis(acetylacetonate) aluminum, triethoxy•mono(ethylacetoacetate)aluminum, tri-n-propoxy•mono(ethylacetoacetate)aluminum, tri-i-propoxy•mono(ethylacetoacetate)aluminum, tri-n-butoxy•mono(ethylacetoacetate)aluminum, tri-sec-butoxy•mono(ethylacetoacetate) aluminum, tri-t-butoxy•mono(ethylacetoacetate)aluminum, diethoxy•bis (ethylacetoacetate)aluminum, di-n-propoxy•bis (ethylacetoacetate)aluminum, di-i-propoxy•bis (ethylacetoacetate)aluminum, di-n-butoxy•bis (ethylacetoacetate)aluminum, di-sec-butoxy•bis (ethylacetoacetate) aluminum, di-t-butoxy•bis (ethylacetoacetate)aluminum, monoethoxy•tris (ethylacetoacetate)aluminum, mono-n-propoxy•tris (ethylacetoacetate)aluminum, mono-i-propoxy•tris (ethylacetoacetate)aluminum, mono-n-butoxy•tris (ethylacetoacetate)aluminum, mono-sec-butoxy•tris (ethylacetoacetate)aluminum, mono-t-butoxy•tris (ethylacetoacetate)aluminum, tetrakis(ethylacetoacetate) aluminum, mono(acetylacetonate)tris(ethylacetoacetate) aluminum, bis(acetylacetonate)bis(ethylacetoacetate) aluminum, and tris(acetylacetonate)mono(ethylacetoacetate) aluminum can be given.

In particular, at least one of $(CH_3(CH_3)HCO)_{4-t}Ti$ $(CH_3COCH_2COCH_3)_t$, $(CH_3(CH_3)HCO)_{4-t}Ti$ $(CH_3COCH_2COOC_2H_5)_t$, $(C_4H_9O)_{4-t}Ti$ $(CH_3COCH_2COCH_3)_t$, $(C_4H_9O)_{4-t}Ti$ $(CH_3COCH_2COOC_2H_5)_t$, $(C_2H_5(CH_3)CO)_{4-t}Ti$ $(CH_3COCH_2COCH_3)_t$, $(C_2H_5(CH_3)CO)_{4-t}Ti$ $(CH_3COCH_2COOC_2H_5)_t$, $(CH_3(CH_3)HCO)_{4-t}Zr$ $(CH_3COCH_2COCH_3)_t$, $(CH_3(CH_3)HCO)_{4-t}Zr$ $(CH_3COCH_2COOC_2H_5)_t$, $(C_4H_9O)_{4-t}Zr$ $(CH_3COCH_2COCH_3)_t$, $(C_4H_9O)_{4-t}Zr$ $(CH_3COCH_2COOC_2H_5)_t$, $(C_2H_5(CH_3)CO)_{4-t}Zr$ $(CH_3COCH_2COCH_3)_t$, $(C_2H_5(CH_3)CO)_{4-t}Zr$ $(CH_3COCH_2COOC_2H_5)_t$, $(CH_3(CH_3)HCO)_{3-t}Al$ $(CH_3COCH_2COCH_3)_t$, $(CH_3(CH_3)HCO)_{3-t}Al$ $(CH_3COCH_2COOC_2H_5)_t$, $(C_4H_9O)_{3-t}Al$ $(CH_3COCH_2COCH_3)_t$, $(C_4H_9O)_{3-t}Al$ $(CH_3COCH_2COOC_2H_5)_t$, $(C_2H_5(CH_3)CO)_{3-t}Al$ $(CH_3COCH_2COCH_3)_t$, $(C_2H_5(CH_3)CO)_{3-t}Al$ $(CH_3COCH_2COOC_2H_5)_t$, and the like is preferable as the metal chelate compound.

The metal chelate compound is used in an amount of 0.0001 to 10 parts by weight, and preferably 0.001 to 5 parts by weight for 100 parts by weight of the silane compounds 1 to 4 in total (converted to complete hydrolysis-condensation product) at the time of hydrolysis and condensation. If the amount of the metal chelate compound is less than 0.0001 parts by weight, coating applicability may be decreased. If the amount of the metal chelate compound exceeds 10 parts by weight, polymer growth may not be controlled, whereby gelation may occur. The metal chelate compound may be added in advance to the organic solvent at the time of hydrolysis and condensation together with the silane compounds 1 to 4, or may be dissolved or dispersed in water when adding water.

When subjecting the silane compounds 1 to 4 to hydrolysis and condensation in the presence of the metal chelate compound, it is preferable to add water in an amount of 0.5 to 20 mol, and particularly preferably 1 to 10 mol for one mol of the silane compounds 1 to 4 in total. If the amount of water added is less than 0.5 mol, the hydrolysis reaction does not sufficiently proceed, whereby applicability and storage stability may be decreased. If the amount of water added exceeds 20 mol, polymer precipitation or gelation may occur during the hydrolysis and condensation reaction. It is preferable that the water be added intermittently or continuously.

1.1.6b Acidic Compound

As the acidic compound which may be used at the time of hydrolysis and condensation of the silane compounds 1 to 4, organic acids or inorganic acids can be given. As examples of the organic acids, acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, succinic acid, fumaric acid, itaconic acid, mesaconic acid, citraconic acid, malic acid, malonic acid, hydrolysate of glutaric acid, hydrolysate of maleic anhydride, hydrolysate of phthalic anhydride, and the like can be given. As examples of the inorganic acids, hydrochloric acid, nitric acid, sulfuric acid, hydrofluoric acid, phosphoric acid, and the like can be given. In particular, the organic acids are preferable since polymer precipitation or gelation rarely occurs during the hydrolysis and condensation reaction. Among the organic acids, a compound including a carboxyl group is still more preferable. In particular, acetic acid, oxalic acid, maleic acid, formic acid, malonic acid, phthalic acid, fumaric acid, itaconic acid, succinic acid, mesaconic acid, citraconic acid, malic acid, glutaric acid, and a hydrolysate of maleic anhydride are preferable. These compounds may be used either individually or in combination of two or more.

The acidic compound is used in an amount of 0.0001 to 10 parts by weight, and preferably 0.001 to 5 parts by weight for 100 parts by weight of the silane compounds 1 to 4 in total (converted to complete hydrolysis-condensation product) at the time of hydrolysis and condensation. If the amount of the acidic compound used is less than 0.0001 parts by weight, coating applicability may be decreased. If the amount of the metal chelate compound exceeds 10 parts by weight, the hydrolysis and condensation reaction may proceed rapidly, whereby gelation may occur. The acidic compound may be added in advance to the organic solvent at the time of hydrolysis and condensation together with the silane compounds 1 to 4, or may be dissolved or dispersed in water when adding water.

When subjecting the silane compounds 1 to 4 to hydrolysis and condensation in the presence of the acidic compound, it is preferable to add water in an amount of 0.5 to 20 mol, and particularly preferably 1 to 10 mol for one mol of the silane compounds 1 to 4 in total. If the amount of water added is less than 0.5 mol, the hydrolysis reaction does not proceed sufficiently, whereby applicability and storage stability may be decreased. If the amount of water added exceeds 20 mol, polymer precipitation or gelation may occur during the hydrolysis and condensation reaction. It is preferable that the water be added intermittently or continuously.

1.1.6c Basic Compound

As examples of the basic compounds which may be used at the time of hydrolysis and condensation of the silane compounds 1 to 4, sodium hydroxide, potassium hydroxide, lithium hydroxide, cerium hydroxide, barium hydroxide, calcium hydroxide, pyridine, pyrrole, piperazine, pyrrolidine, piperidine, picoline, ammonia, methylamine, ethylamine, propylamine, butylamine, dimethylamine, diethylamine, dipropylamine, dibutylamine, trimethylamine, triethylamine, tripropylamine, tributylamine, monoethanolamine, diethanolamine, dimethylmonoethanolamine, monomethyldiethanolamine, triethanolamine, diazabicyclooctane, diazabicyclononane, diazabicycloundecene, urea, tetramethylammonium hydroxide, tetraethylammonium hydroxide, tetrapropylammonium hydroxide, tetrabutylammonium hydroxide, benzyltrimethylammonium hydroxide, choline, and the like can be given. Of these, ammonia, organic amines, and ammonium hydroxides are preferable, with tetramethylammonium hydroxide, tetraethylammonium hydroxide, and tetrapropylammonium hydroxide being particularly preferable. The basic compounds may be used either individually or in combination of two or more.

The basic compound is used in an amount of usually 0.00001 to 1 mol, and preferably 0.00005 to 0.5 mol for one mol of the groups represented by R"O— (n=2, 3, 5, 7, or 8) in the general formulas (1) to (4), which is the total amount of the alkoxyl groups of the silane compounds 1 to 4. If the amount of the basic compound used is within the above range, polymer precipitation or gelation rarely occurs during the reaction.

When subjecting the silane compounds 1 to 4 to hydrolysis and condensation in the presence of the basic compound, it is preferable to add water in an amount of 0.5 to 150 mol, and particularly preferably 1 to 130 mol for one mol of the silane compounds 1 to 4 in total. If the amount of water added is less than 0.5 mol, a long time is required for the hydrolysis and condensation reaction, whereby productivity is decreased. If the amount of water added exceeds 150 mol, polymer precipitation or gelation may occur during the hydrolysis and condensation reaction.

In this case, it is preferable to use an alcohol having a boiling point of 100° C. or less together with water. As examples of the alcohol having a boiling point of 100° C. or less used, methanol, ethanol, n-propanol, and isopropanol can be given. The alcohol having a boiling point of 100° C. or less is used in an amount of usually 3 to 100 mol, and preferably 5 to 80 mol for one mol of the silane compounds 1 to 4 in total.

The alcohol having a boiling point of 100° C. or less may be produced during hydrolysis and/or condensation of the silane compounds 1 to 4. In this case, it is preferable to remove the alcohol having a boiling point of 100° C. or less by distillation or the like so that the content becomes 20 wt % or less, and preferably 5 wt % or less. A dehydrating agent such as methyl orthoformate, a metal complex, or a leveling agent may be included as an additive.

After obtaining a hydrolysis-condensation product from the silane compounds 1 to 4 in the presence of the basic compound, it is preferable to adjust the pH of the film forming composition according to the embodiment to 7 or less. As the pH adjustment method, 1) a method of adding a pH adjustment agent, 2) a method of evaporating the basic compound from the composition under normal pressure or reduced pressure, 3) a method of removing the basic compound from the composition by bubbling a gas such as nitrogen or argon through the composition, 4) a method of removing the basic compound from the composition using an ion-exchange resin, 5) a method of removing the basic compound from the system by extraction or washing, and the like can be given. These methods may be used in combination.

As the pH adjustment agent, inorganic acids and organic acids can be given. As examples of the inorganic acids, hydrochloric acid, nitric acid, sulfuric acid, hydrofluoric acid, phosphoric acid, boric acid, oxalic acid, and the like can be given. As examples of the organic acids, acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, succinic acid, itaconic acid, mesaconic acid, citraconic acid, malic acid, hydrolysate of glutaric acid, hydrolysate of maleic anhydride, hydrolysate of phthalic anhydride, and the like can be given. These compounds may be used either individually or in combination of two or more.

The pH of the composition is adjusted to 7 or less, and preferably 1 to 6 using the pH adjustment agent. The storage stability of the film forming composition is improved by adjusting the pH within the above range using the pH adjustment agent. The pH adjustment agent is used in such an amount that the pH of the film forming composition is within the above range. The amount of the pH adjustment agent is appropriately selected.

1.1.6d Organic Solvent

In the invention, the silane compounds 1 to 4 may be subjected to hydrolysis and condensation in an organic solvent. The organic solvent is preferably a solvent shown by the following general formula (6).

$R^{13}O(CHCH_3CH_2O)_\gamma R^{14}$ (6)

wherein $R^{13}$ and $R^{14}$ individually represent a hydrogen atom or a monovalent organic group selected from an alkyl group having 1 to 4 carbon atoms and $CH_3CO-$, and γ represents 1 or 2.

As examples of the alkyl groups having 1 to 4 carbon atoms in the general formula (6), the groups given as the alkyl groups for the general formula (1) can be given.

As specific examples of the organic solvent shown by the general formula (6), propylene glycol monomethyl ether, propylene glycol monoethyl ether, propylene glycol monopropyl ether, propylene glycol monobutyl ether, propylene glycol dimethyl ether, propylene glycol diethyl ether, propylene glycol dipropyl ether, propylene glycol dibutyl ether, dipropylene glycol monomethyl ether, dipropylene glycol monoethyl ether, dipropylene glycol monopropyl ether, dipropylene glycol monobutyl ether, dipropylene glycol dimethyl ether, dipropylene glycol diethyl ether, dipropylene glycol dipropyl ether, dipropylene glycol dibutyl ether, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol mono ethyl ether acetate, dipropylene glycol monopropyl ether acetate, dipropylene glycol monobutyl ether acetate, propylene glycol diacetate, dipropylene glycol diacetate, and the like can be given. Of these, propylene glycol monomethyl ether, propylene glycol monoethyl ether, propylene glycol monopropyl ether, propylene glycol monobutyl ether, propylene glycol dimethyl ether, propylene glycol diethyl ether, propylene glycol monomethyl ether acetate, propylene glycol monoethyl ether acetate, and propylene glycol monopropyl ether acetate are preferable. These solvents may be used either individually or in combination of two or more. Another solvent such as an ester solvent and an amide solvent may be included in a small amount together with the solvent shown by the general formula (6).

The total solid content of the film forming composition according to the embodiment is appropriately adjusted depending on the target application, preferably in the range of 0.1 to 10 wt %. If the total solid content of the film forming composition according to the embodiment is 0.1 to 10 wt %, the resulting coating has a thickness within an appropriate range, and the composition exhibits a more excellent storage stability. The total solid content is adjusted by concentration or dilution with an organic solvent, if necessary.

1.2 Organic Solvent

As the organic solvent which may be used in the invention, at least one solvent selected from the group consisting of alcohol solvents, ketone solvents, amide solvents, ether solvents, ester solvents, aliphatic hydrocarbon solvents, aromatic solvents, and halogen-containing solvents may be used.

Examples of the alcohol solvents include: monohydric alcohol solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol, and diacetone alcohol;

polyhydric alcohol solvents such as ethylene glycol, 1,2-propylene glycol, 1,3-butylene glycol, pentanediol-2,4,2-methylpentanediol-2,4, hexanediol-2,5, heptanediol-2,4,2-ethylhexanediol-1,3, diethylene glycol, dipropylene glycol, triethylene glycol, and tripropylene glycol;

polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, and dipropylene glycol monopropyl ether; and the like. These alcohol solvents may be used either individually or in combination of two or more.

As examples of the ketone solvents, acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylenonane, cyclopentanone, cyclohexanone, cycloheptanone, cyclooctanone, 2-hexanone, methylcyclohexanone, 2,4-pentanedione, acetonylacetone, diacetone alcohol, acetophenone, fenchone, and the like can be given. These ketone solvents may be used either individually or in combination of two or more.

As examples of the amide solvents, nitrogen-containing solvents such as N,N-dimethylimidazolidinone, N-methylformamide, N,N-dimethylformamide, N,N-dimethylformamide, acetamide, N-methylacetamide, N,N-dimethylacetamide, N-methylpropioneamide, N-methylpyrrolidone, and the like can be given. These amide solvents may be used either individually or in combination of two or more.

As examples of the ether solvents, ethyl ether, i-propyl ether, n-butyl ether, n-hexyl ether, 2-ethylhexyl ether, ethylene oxide, 1,2-propylene oxide, dioxolane, 4-methyl dioxolane, dioxane, dimethyl dioxane, ethylene glycol monoethyl ether, ethylene glycol dimethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethyl butyl ether, ethylene glycol dibutyl ether, diethylene glycol monomethyl ether, diethylene glycol dimethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, tripropylene glycol monomethyl ether, tetrahydrofuran, 2-methyltetrahydrofuran, diphenyl ether, anisole, and the like can be given. These ether solvents may be used either individually or in combination of two or more.

As examples of the ester solvents, diethyl carbonate, propylene carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like can be given. These ester solvents may be used either individually or in combination of two or more.

As examples of the aliphatic hydrocarbon solvents, n-pentane, i-pentane, n-hexane, i-hexane, n-heptane, i-heptane, 2,2,4-trimethylpentane, n-octane, i-octane, cyclohexane, methylcyclohexane, and the like can be given. These aliphatic hydrocarbon solvents may be used either individually or in combination of two or more.

As examples of the aromatic hydrocarbon solvents, benzene, toluene, xylene, ethylbenzene, trimethylbenzene, methylethylbenzene, n-propylebenzene, i-propylebenzene, diethylbenzene, i-butylbenzene, triethylbenzene, di-i-propylbenzene, n-amylnaphthalene, trimethylbenzene, and the like can be given. These aromatic hydrocarbon solvents may be used either individually or in combination of two or more. As examples of the halogen-containing solvents, dichloromethane, chloroform, fluorocarbon, chlorobenzene, dichlorobenzene, and the like can be given.

In the invention, it is preferable to use an organic solvent having a boiling point of less than 150° C. As the type of solvent, an alcohol solvent, a ketone solvent, and an ester solvent are particularly preferable. It is preferable to use one or more of these solvents.

1.3 Other Additives

The film forming composition according to one embodiment of the invention may further include components such as an organic polymer, a surfactant, and a silane coupling agent. These additives may be added to the solvent in which each component has been dissolved or dispersed before producing the film forming composition.

1.3.1 Organic Polymer

The organic polymer used in the invention may be added as a readily decomposable component for forming voids in the silica-based film. The addition of such an organic polymer is described in references such as Japanese Patent Application Laid-open No. 2000-290590, Japanese Patent Application Laid-open No. 2000-313612, and Hedrick, J. L., et al. "Templating Nanoporosity in Thin Film Dielectric Insulators", Adv. Mater., 10 (13), 1049, 1998. An organic polymer similar to those described in these references may be added.

As examples of the organic polymer, a polymer having a sugar chain structure, vinyl amide polymer, (meth)acrylic polymer, aromatic vinyl compound polymer, dendolimer, polyimide, polyamic acid, polyarylene, polyamide, polyquinoxaline, polyoxadizole, fluorine-containing polymer, polymer having a polyalkylene oxide structure, and the like can be given.

1.3.2 Surfactant

As examples of the surfactant, a nonionic surfactant, an anionic surfactant, a cationic surfactant, an amphoteric surfactant, and the like can be given. As specific examples, a fluorine-containing surfactant, a silicone surfactant, a polyalkylene oxide surfactant, a poly(meth)acrylate surfactant, and the like can be given. Of these, the fluorine-containing surfactant and the silicone surfactant are preferable.

As examples of the fluorine-containing surfactant, compounds having a fluoroalkyl or fluoroalkylene group in at least one of the terminal, main chain, and side chain, such as 1,1,2,2-tetrafluorooctyl(1,1,2,2-tetrafluoropropyl)ether, 1,1,2,2-tetrafluorooctylhexyl ether, octaethylene glycol di(1,1,2,2-tetrafluorobutyl)ether, hexaethylene glycol (1,1,2,2,3,3-hexafluoropentyl)ether, octapropylene glycol di(1,1,2,2-tetrafluorobutyl)ether, hexapropylene glycol di(1,1,2,2,3,3-hexafluoropentyl)ether, sodium perfluorododecylsulfonate, 1,1,2,2,8,8,9,9,10,10-decafluorododecane, 1,1,2,2,3,3-hexafluorodecane, N-3-(perfluorooctanesulfonamide)-propyl-N,N'-dimethyl-N-carboxymethylene ammonium betaine, perfluoroalkyl sulfonamide propyltrimethyl ammonium salt, perfluoroalkyl-N-ethylsulfonyl glycine salt, bis(N-perfluorooctylsulfonyl-N-ethylaminoethyl)phosphate, and monoperfluoroalkylethyl phosphate can be given.

As examples of commercially available products of the fluorine-containing surfactant, Megafac F142D, F172, F173, F183 (manufactured by Dainippon Ink and Chemicals, Inc.), Eftop EF301, EF303, EF352 (manufactured by Shin-Akita Kasei Co., Ltd.), Fluorad FC-430, FC-431 (manufactured by Sumitomo 3M, Ltd.), Asahi Guard AG710, Surflon S-382, SC-101, SC-102, SC-103, SC-104, SC-105, SC-106 (manufactured by Asahi Glass Co., Ltd.), BM-1000, BM-1100 (manufactured by BM Chemie), and NBX-15 (manufactured by NEOS Co., Ltd.) can be given. Of these, Megafac F172, BM-1000, BM-1100, and NBX-15 are particularly preferable.

As the silicone surfactant, SH7PA, SH21PA, SH28PA, SH30PA, ST94PA (manufactured by Toray-Dow Corning Silicone Co., Ltd.) and the like may be used. Of these, SH28PA and SH30PA are particularly preferable.

The surfactant is used in an amount of usually 0.00001 to 1 part by weight for 100 parts by weight of the film forming composition. The surfactant may be used either individually or in combination of two or more.

1.3.3 Silane Coupling Agent

As examples of the silane coupling agent, 3-glycidyloxypropyltrimethoxysilane, 3-aminoglycidyloxypropyltriethoxysilane, 3-methacryloxypropyltrimethoxysilane, 3-glycidyloxypropylmethyldimethoxysilane, 1-methacryloxypropylmethyldimethoxysilane, 3-aminopropyltrimethoxysilane, 3-aminopropyltriethoxysilane, 2-aminopropyltrimethoxysilane, 2-aminopropyltriethoxysilane, N-(2-aminoethyl)-3-aminopropyltrimethoxysilane, N-(2-aminoethyl)-3-aminopropylmethyldimethoxysilane, 3-ureidopropyltrimethoxysilane, 3-ureidopropyltriethoxysilane, N-ethoxycarbonyl-3-aminopropyltrimethoxysilane, N-ethoxycarbonyl-3-aminopropyltriethoxysilane, N-triethoxysilylpropyltriethylenetriamine, N-triethoxysilylpropyltriethylenetriamine, 10-trimethoxysilyl-1,4,7-triazadecane, 10-triethoxysilyl-1,4,7-triazadecane, 9-trimethoxysilyl-3,6-diazanonylacetate, 9-triethoxysilyl-3,6-diazanonylacetate, N-benzyl-3-aminopropyltrimethoxysilane, N-benzyl-3-aminopropyltriethoxysilane, N-phenyl-3-aminopropyltrimethoxysilane, N-phenyl-3-aminopropyltriethoxysilane, N-bis(oxyethylene)-3-aminopropyltrimethoxysilane, N-bis(oxyethylene)-3-aminopropyltriethoxysilane, and the like can be given. The silane coupling agent may be used either individually or in combination of two or more.

2. FILM FORMATION METHOD

A method of forming an organic silica-based film according to one embodiment of the invention includes applying the film forming composition to a substrate to form a coating, heating the coating, and applying ultraviolet radiation to the coating to effect a curing treatment. In the curing treatment in the invention, it is preferable to simultaneously perform the heating and the ultraviolet radiation application. The condensation reaction of the organic silica sol can be sufficiently achieved at a comparatively low temperature in a short time by simultaneously performing the heating and the ultraviolet radiation application, whereby an objective organic silica-based film of the invention can be obtained. The curing treatment can be performed preferably within 30 sec to 10 min, and still more preferably within 30 sec to 7 min by simultaneously performing the heating and the ultraviolet radiation application.

According to the method of forming an organic silica-based film according to the embodiment, since the curing treatment can be performed at a low temperature in a short time, damage to a semiconductor device does not occur, whereby the single-wafer processing can be performed in the LSI process.

The curing method for the coating is described below in detail.

A ultraviolet radiation application may be performed by using ultraviolet radiation having a wavelength of preferably 250 nm or less, and still more preferably 150 to 250 nm. The condensation reaction of the molecules in the organic silica sol can be performed at a low temperature in a short time without using a UV-active reaction promoter by using ultraviolet radiation having a wavelength in this range. If the wavelength of ultraviolet radiation is longer than 250 nm, a sufficient promoting effect of the condensation reaction in the organic silica sol is not obtained. If the wavelength of ultraviolet radiation is shorter than 150 nm, decomposition of the organic group or elimination of the organic group from the silicon atom tends to occur in the organic silica sol.

In the ultraviolet radiation application, it is preferable to use a light source which emits ultraviolet radiation having a plurality of wavelengths of 250 nm or less in order to prevent a local change in film quality due to the standing wave caused by reflection from the substrate to which the film forming composition is applied.

In the coating curing treatment of the invention, the heating may be performed at a temperature of preferably 300 to 450° C. If the heating temperature is lower than 300° C., the mobility of the molecular chains in the organic silica sol is not increased, whereby a sufficiently high condensation rate cannot be obtained. If the heating temperature is higher than 450° C., the molecules in the organic silica sol tend to be decomposed. Moreover, a heating temperature higher than 450° C. may be inconsistent with a step performed in the semiconductor device manufacturing process, such as a copper damascene process which is usually performed at 450° C. or less. As the heating method performed simultaneously with the ultraviolet radiation application, a hot plate, infrared lamp annealing, or the like may be used.

The coating curing treatment of the invention may be performed in an inert atmosphere or under reduced pressure. In the curing treatment, it is preferable that the ultraviolet radiation application be performed in the absence of oxygen. The statement "the absence of oxygen" means that the oxygen partial pressure is preferably 0.1 kPa or less, and still more preferably 0.01 kPa or less. If the oxygen partial pressure is higher than 0.1 kPa, ozone is produced during the ultraviolet radiation application and oxidizes the condensate of the organic silica sol. As a result, the hydrophilicity of the resulting organic silica-based film is increased, whereby the hygroscopicity and the relative dielectric constant of the film tend to be increased. Therefore, an organic silica-based film which has high hydrophobicity and of which the relative dielectric constant is rarely increased can be obtained by performing the curing treatment in the absence of oxygen.

In the invention, the ultraviolet radiation application may be performed in an inert gas atmosphere. As the inert gas used, $N_2$, He, Ar, Kr, and Xe (preferably He and Ar) can be given. The film is rarely oxidized by performing the ultraviolet radiation application in an inert gas atmosphere, whereby the low dielectric constant of the resulting coating can be maintained.

In the invention, the ultraviolet radiation application may be performed under reduced pressure. The pressure is preferably 0.001 to 1000 kPa, and still more preferably 0.001 to 101.3 kPa. If the pressure is outside the above range, the degree of curing may become nonuniform in the film. In order to control the curing rate of the coating, the coating may be heated step-wise, or the atmospheric conditions such as the inert gas such as nitrogen or the reduced pressure state may be appropriately selected.

As examples of the substrate to which the film forming composition is applied, Si-containing layers such as Si, $SiO_2$, SiN, SiC, and SiCN can be given. As the method for applying the film forming composition to the substrate, a coating method such as spin coating, dip coating, roll coating, or spray coating may be used. After applying the film forming composition to the substrate, the solvent is removed to form the coating. A coating with a dry thickness of 0.05 to 2.5 μm is obtained by single application, and a coating with a dry thickness of 0.1 to 5.0 μm is obtained by double application. An organic silica-based film can be formed by subjecting the resulting coating to the above-described curing treatment.

3. ORGANIC SILICA-BASED FILM

The organic silica-based film according to one embodiment of the invention has an extremely high modulus of elasticity and film density and exhibits a low dielectric constant as is clear from examples described later. The organic silica-based film according to the embodiment has a sufficiently high crosslink density from the viewpoint of the film shrinkage rate, modulus of elasticity, and the like. In more detail, the organic silica-based film according to the embodiment has a relative dielectric constant of preferably 1.5 to 3.5, and still more preferably 1.8 to 3.0, a modulus of elasticity of preferably 4.0 to 15.0 GPa, and still more preferably 4.0 to 12.0 GPa, and a film density of preferably 0.7 to 1.3 $g/cm^3$, and still more preferably 0.8 to 1.27 $g/cm^3$. Therefore, the organic silica-based film according to the embodiment exhibits excellent insulating film properties such as mechanical strength and relative dielectric constant.

The organic silica-based film according to the embodiment has a water contact angle of preferably 60° or more, and still more preferably 70° or more. This indicates that the organic silica-based film according to the embodiment is hydrophobic so that the organic silica-based film can maintain a low hygroscopicity and a low relative dielectric constant. The organic silica-based film is rarely damaged by RIE used in the semiconductor process due to low hygroscopicity, and exhibits excellent chemical resistance against a wet cleaning liquid. In particular, this tendency is significant in an organic silica-based film having a relative dielectric constant k of 2.5 or less in which the insulating film has a porous structure.

As described above, the organic silica-based film according to the embodiment has characteristics such as (a) excellent insulating film properties such as a relative dielectric constant and a modulus of elasticity and capability of being formed at a low temperature in a short time since the film forming composition has a specific composition and carbon content, (b) the absence of a substance contaminating a semiconductor device since it is unnecessary for the film forming composition to include an ionic substance such as a UV-active acid generator, base generator, and photosensitizer, a charge carrier, or a corrosive compound generation source, (c) being cured by a curing method which rarely causes damage to the transistor structure formed by the semiconductor process such as RIE and allows the single-wafer process, (d) a low relative dielectric constant due to high hydrophobicity and low hygroscopicity, and (e) the capability of withstanding formation of a copper damascene structure or the like due to excellent mechanical strength as evidenced by a greater modulus of elasticity.

In the film forming composition according to one embodiment of the invention, the molecular chain mobility can be increased and the amount of residual silanol after curing can be decreased by relatively reducing the amount of the component Q to increase the amount of trifunctional silane compound (component T) (rich in component T). It was found that such a film forming composition can produce an organic silica film having lower hygroscopicity in comparison with a film which requires curing by heating for a long time, by applying and drying the composition and subjecting the dried composition to heating and ultraviolet radiation application preferably in the absence of oxygen. A detailed mechanism by which such an organic silica-based film is obtained has not been clarified. It is considered that the diffusion barrier at the time of the solid-phase reaction is decreased by reducing the amount of the component Q and heating the composition, and the reaction probability in the site excited by ultraviolet radiation is increased.

Specifically, the degree of condensation of the film forming composition according to the embodiment is increased by the heating and the ultraviolet radiation application in a short time in comparison with a related-art composition which requires curing by heating for a long time. An increase in the degree of condensation means a decrease in the amount of residual silanol. The hydrophobicity of the organic silica-based film after curing is remarkably improved by an increase in the degree of condensation in addition to the feature of the organic silica sol having a high carbon content (11.8 to 16.7 mol %) in comparison with the related-art technology (e.g. Example 1 of U.S. Pat. No. 6,413,647). An increase in the degree of condensation also means an increase in the crosslink density so that the mechanical strength is improved as evidenced by a greater modulus of elasticity. When curing a system containing a small amount of the component Q such as the film forming composition according to the embodiment by heating the system, the resulting organic silica film has an insufficient modulus of elasticity in comparison with an organic silica film obtained by curing a component Q-rich composition by heating the composition. However, the organic silica film obtained by curing the film forming composition according to the embodiment by heating and ultraviolet radiation application has a modulus of elasticity equal to or higher than that of the organic silica film obtained by using the component Q-rich composition. As described above, the film forming composition according to the embodiment can produce an organic silica-based film having sufficient hydrophobicity and a high modulus of elasticity.

Since the organic silica-based film according to one embodiment of the invention has the above-described features, the organic silica-based film is particularly useful as an interlayer dielectric for a semiconductor device such as an LSI, system LSI, DRAM, SDRAM, RDRAM, or D-RDRAM. Moreover, the organic silica-based film can be suitably used in semiconductor device applications such as an etching stopper film, a protective film such as a surface coating film for a semiconductor element, an intermediate layer used in the semiconductor device manufacturing process using a multilayer resist, and an interlayer dielectric for a multilayer interconnect substrate. The silica-based film according to the embodiment is also useful for a semiconductor device including a copper damascene process.

4. EXAMPLES

The invention is described below in more detail by way of examples. However, the invention should not be construed as being limited to the following examples. In the examples and comparative examples, "part" and "%" respectively indicate "part by weight" and "wt %" unless otherwise indicated.

4.1. Examples and Comparative Examples

A film forming composition was produced and a silica-based film was formed as described below.

4.1.1 Method of Producing Film Forming Composition

Film forming compositions of Examples 1 to 3 and Comparative Example 1 were obtained according to the compositions shown in Table 1.

4.1.1a Example 1

In a quartz flask equipped with a condenser, 69.3 g of tetramethoxysilane as the component Q, 135.3 g of methyltrimethoxysilane as the component T, and 74.6 g of dimethyldimethoxysilane as the component D were dissolved in 202.8 g of propylene glycol monoethyl ether. The mixture was stirred using a three-one motor to stabilize the solution temperature at 55° C. Then, 217.6 g of ion-exchanged water, in which 0.45 g of oxalic acid was dissolved, was added to the solution in one hour. The mixture was then allowed to react at 55° C. for three hours. After the addition of 837.2 g of propylene glycol monoethyl ether, the reaction solution was cooled to room temperature. The reaction solution was concentrated under reduced pressure until the solid content became 10% to obtain a film forming composition 1. The carbon content of the organic silica sol included in the composition 1 was 15.9 mol %. The composition 1 had a sodium content of 0.7 ppb, a potassium content of 0.4 ppb, and an iron content of 1.7 ppb. The weight average molecular weight of the condensate was 2,100.

4.1.1b Example 2

In a quartz flask equipped with a condenser, 41.2 g of tetramethoxysilane and 180.1 g of methyltrimethoxysilane were dissolved in 227.3 g of propylene glycol monoethyl ether. After the addition of 136.5 g of ion-exchanged water to the solution, the mixture was stirred for one hour. After the addition of a solution prepared by dissolving 0.106 g of tetrakis(acetylacetonate)titanium in 79.9 g of propylene glycol monoethyl ether, the mixture was allowed to react at 50° C. for three hours. After the addition of 887.4 g of propylene glycol monoethyl ether, the reaction solution was cooled to room temperature. The reaction solution was concentrated under reduced pressure until the solid content became 15%. After the addition of 35.0 g of acetylacetone, propylene glycol monoethyl ether was added so that the solid content became 10% to obtain a film forming composition 2. The organic silica sol included in the composition 2 had a carbon content of 14.1 mol %, a sodium content of 0.3 ppb, a potassium content of 0.1 ppb, and an iron content of 2.4 ppb. The weight average molecular weight of the condensate was 1,500.

4.1.1c Example 3

A quartz flask equipped with a condenser was charged with 5.2 g of a 25% tetrabutylammonium hydroxide aqueous solution, 124.1 g of ultrapure water, and 536.7 g of ethanol. The mixture was stirred at 25° C. After the continuous addition of 13.5 g of tetraethoxysilane as the component Q and 20.5 g of methyltriethoxysilane as the component T in one hour, the mixture was stirred at 60° C. for one hour. After cooling the reaction solution to room temperature, 1321.6 g of propylene glycol monopropyl ether and 34.1 g of a 20% acetic acid aqueous solution were added. The reaction solution was concentrated under reduced pressure until the solid content became 10% to obtain a film forming composition 3. The organic silica sol included in the composition 3 had a carbon content of 12.8 mol %, a sodium content of 0.3 ppb, a potassium content of 0.2 ppb, and an iron content of 1.9 ppb. The weight average molecular weight of the condensate was 58,000.

4.1.1d Comparative Example 1

A quartz flask equipped with a condenser was charged with 8.3 g of a 20% tetrabutylammonium hydroxide aqueous solution, 118.6 g of ultrapure water, and 516.1 g of isopropyl alcohol. The mixture was stirred at 40° C. After the continuous addition of 34.4 g of tetraethoxysilane and 22.5 g of methyltriethoxysilane in one hour, the mixture was stirred at 80° C. for one hour. After cooling the reaction solution to room temperature, 1269.4 g of propylene glycol monopropyl ether and 55.5 g of a 20% acetic acid aqueous solution were added. The reaction solution was concentrated under reduced pressure until the solid content became 10% to obtain a film forming composition 4. The organic silica sol included in the composition 4 had a carbon content of 10.5 mol %, a sodium content of 0.4 ppb, a potassium content of 0.1 ppb, and an iron content of 1.4 ppb. The weight average molecular weight of the condensate was 52,000.

TABLE 1

| | | Carbon content (mol %) | Component Q (mol %) | Component T (mol %) | Component D (mol %) | Mw |
|---|---|---|---|---|---|---|
| Example 1 | Composition 1 | 15.9 | 22 | 48 | 30 | 2,100 |
| Example 2 | Composition 2 | 14.1 | 17 | 83 | — | 1,500 |
| Example 3 | Composition 3 | 12.8 | 30 | 70 | — | 58,000 |
| Comparative Example 1 | Composition 4 | 10.5 | 50 | 50 | — | 52,000 |

4.2. Method of Forming Organic Silica-Based Film

Organic silica-based films of Examples 4 to 8, Comparative Examples 2 to 7, and Reference Example 1 were obtained using the compositions and the curing conditions shown in Table 2.

4.2.1 Examples 4 to 8, Comparative Examples 2 to 7, and Reference Example 1

The film forming composition obtained in (1) was applied to an 8-inch silicon wafer using a spin coating method. The coating was dried at 90° C. for one minute on a hot plate and at 200° C. for one minute in a nitrogen atmosphere. The coating was cured by applying ultraviolet radiation while heating the coating on the hot plate to obtain an organic silica-based film sample. The type of the film forming composition and the curing conditions are shown in Table 2.

As the ultraviolet radiation source, a white ultraviolet radiation source emitting ultraviolet radiation having a wavelength of 250 nm or less (ultraviolet radiation 1) and a mercury lamp emitting ultraviolet radiation mainly having a wavelength greater than 250 nm (ultraviolet radiation 2) were used. Since the ultraviolet radiation 1 is white ultraviolet light, the illuminance of the ultraviolet radiation 1 could not be measured by an effective method.

In Examples 4 to 8, heating and application of the ultraviolet radiation 1 were performed at the same time in the curing treatment. In Comparative Examples 2, 3, 5, and 7, samples were obtained by curing the coating by performing only a heat treatment at 420° C. for 60 minutes without applying ultraviolet radiation. In Comparative Examples 4 and 6 and Reference Example 1, heating and ultraviolet radiation application were performed at the same time. However, some of the curing conditions differed from the curing conditions in the examples as follows. Specifically, the ultraviolet radiation 1 was used in Reference Example 1 while adjusting the oxygen partial pressure to 1 kPa. In Comparative Example 4, the ultraviolet radiation 2 was used. In Comparative Example 6, the composition 4 of Comparative Example 1 was used.

modulus of elasticity of the insulating film formed by the above-described method was measured by a continuous stiffness measurement method.

4.2.2c Contact Angle

In order to measure the hydrophobicity of the film, an ultrapure water droplet was dropped onto the surface of the insulating film formed by the above-described method using a contact angle measurement device (DropMaster 500) manufactured by Kyowa Interface Science Co., Ltd. to measure the contact angle.

4.2.2d Condensation Rate

In order to measure the condensation rate of the siloxane bond, the signal area of the $^{29}$Si-NMR spectrum was determined for the cured coating (organic silica-based film) using a nuclear magnetic resonance (NMR) method.

TABLE 2

| | | | UV curing conditions | | | Characteristics | | | |
| | | | | | | Relative | | | |
| | Composition | Curing method | Temp. (° C.) | Time (min) | Oxygen partial pressure (kPa) | dielectric constant | Δk | Modulus of elasticity | Contact angle |
|---|---|---|---|---|---|---|---|---|---|
| Example 4 | 1 | Ultraviolet radiation 1 | 400 | 3 | 0.01 | 2.78 | 0.13 | 5.2 | 101 |
| Comparative Example 2 | 1 | Heat | — | — | — | 2.91 | 0.27 | 3.7 | 93 |
| Example 5 | 2 | Ultraviolet radiation 1 | 440 | 2 | 0.01 | 2.85 | 0.06 | 12.1 | 99 |
| Example 6 | 2 | Ultraviolet radiation 1 | 400 | 3 | 0.01 | 2.87 | 0.09 | 11.7 | 98 |
| Example 7 | 2 | Ultraviolet radiation 1 | 350 | 6 | 0.01 | 2.86 | 0.11 | 9.0 | 94 |
| Comparative Example 3 | 2 | Heat | — | — | — | 3.06 | 0.24 | 8.2 | 91 |
| Example 8 | 3 | Ultraviolet radiation 1 | 400 | 3 | 0.01 | 2.29 | 0.06 | 4.2 | 96 |
| Reference Example 1 | 3 | Ultraviolet radiation 1 | 400 | 3 | 1.00 | 2.35 | 0.15 | 4.4 | 30 |
| Comparative Example 4 | 3 | Ultraviolet radiation 2 | 400 | 3 | 0.01 | 2.40 | 0.19 | 2.9 | 55 |
| Comparative Example 5 | 3 | Heat | — | — | — | 2.33 | 0.13 | 3.2 | 86 |
| Comparative Example 6 | 4 | Ultraviolet radiation 1 | 400 | 3 | 0.01 | 2.24 | 0.14 | 4.3 | 76 |
| Comparative Example 7 | 4 | Heat | — | — | — | 2.24 | 0.10 | 5.2 | 88 |

4.2.2 Evaluation Method

The organic silica-based film obtained in 4.1.(2) was evaluated as described below.

4.2.2a Relative Dielectric Constant and Δk

A relative dielectric constant measurement sample was prepared by forming an aluminum electrode pattern by a vapor deposition method on the organic silica-based film formed on an 8-inch N-type silicon wafer having a resistivity of 0.1 Ω·cm or less using the above-described method. The relative dielectric constant of the organic silica-based film was measured by a CV method at a frequency of 100 kHz using an electrode "HP16451B" and a precision LCR meter "HP4284A" manufactured by Agilent Technologies.

The Δk is the difference between the relative dielectric constant (k@RT) measured at 24° C. and 40% RH and the relative dielectric constant (k@200° C.) measured at 200° C. in a dry nitrogen atmosphere (Δk=k@RT−k@200° C.). An increase in the dielectric constant of the film due to moisture absorption can be evaluated by the Δk. An organic silica film is determined to have high hygroscopicity when the Δk is 0.15 or more.

4.2.2b Modulus of Elasticity of Silica-Based Film

A Berkovich type indenter was installed in a nanohardness tester (Nanoindenter XP) manufactured by MTS, and the In more detail, the organic silica-based film obtained by the above-described method was shaved from the silicon wafer and formed into a solid powder sample using an agate bowl. The sample was packed into a zirconia rotor having an outer diameter of 7 mm, and $^{29}$Si-NMR was carried out by a dipolar decoupled-magic angle spinning ($^{29}$Si-DD-MASN MR) method using a 300 MHz Fourier transform NMR spectrometer (Avance 300 manufactured by Bruker). Since the integrated intensity of the signal obtained by this method reflects the Si abundance, the condensation rate can be measured. The measurement conditions were as follows. The measurement was carried out at a measurement temperature of 30° C., a pulse interval of 10 sec, a sample tube rotational speed of 3000 to 7000 Hz, a center frequency of 59.62 MHz, a frequency range of 15.53 kHz, a data point of 16 k, and a number of transients of 5,000 to 50,000. Polydimethylsiloxane was subjected to measurement in advance as a chemical shift standard sample. The decoupler frequency offset value when correcting the peak of polydimethylsiloxane to −34 ppm was read, and the value of each sample was corrected by inputting the value in the measurement of each sample.

4.2.2e Molecular Weight (Weight Average Molecular Weight: Mw)

The molecular weight (weight average molecular weight: Mw) of the film forming composition was measured by size exclusion chromatography (SEC) under the following conditions.

Sample: A sample was prepared by dissolving 0.1 g of the hydrolysis-condensation product in 100 cc of a 10 mmol/LLiBr—H$_3$PO$_4$ 2-methoxyethanol solution as a solvent.

Standard sample: Polyethylene oxide manufactured by Wako Pure Chemical Industries, Ltd. was used.

System: High-speed GPC system (HLC-8120GPC) manufactured by Tosoh Corp.

Column: Three pieces of "TSK-GEL SUPER AWM-H" (15 cm in length) manufactured by Tosoh Corp provided in series were used.

Temperature: 40° C.

Flow rate: 0.6 ml/min.

Detector: "UV-8220 RI" manufactured by Tosoh Corp.

4.3 Evaluation Results

4.3.1 Relative Dielectric Constant, Δk, Modulus of Elasticity, and Contact Angle The evaluation results are shown in Table 2.

From the comparison of Examples 4 to 8 with Comparative Examples 2, 3, and 5, it was found that an organic silica-based film having a low Δk, a high modulus of elasticity, and excellent mechanical strength can be obtained by curing the film forming composition which includes the organic silica sol having a carbon content of 12.8 mol %, 14.1 mol %, or 15.9 mol % using ultraviolet radiation under heating in comparison with the case of curing the film forming composition by applying only heat.

From Comparative Examples 6 and 7, it was found that an organic silica-based film obtained by curing the film forming composition which includes the organic silica sol having a carbon content of 10.5 mol % by applying the ultraviolet radiation 1 and heat exhibits an inferior modulus of elasticity and Δk in comparison with an organic silica-based film obtained by curing the film forming composition by applying only heat.

From Reference Example 1, a decrease in the contact angle and an increase in Δk, which are considered to be caused by oxidation of the film, were observed when applying heat and ultraviolet radiation in an atmosphere at a high oxygen partial pressure.

From Comparative Example 4, it was found that the modulus of elasticity and Δk are decreased when using ultraviolet radiation having a wavelength of longer than 250 nm.

4.3.2 Molecular Weight (Weight Average Molecular Weight: Mw)

From Examples 2 and 3 and Comparative Example 1, the weight average molecular weight of the condensate was about 1,000 to 60,000. From the results of Examples 4 to 8, it was found that an organic silica-based film having a low Δk, a high modulus of elasticity, and excellent mechanical strength can be obtained over a wide molecular weight range. From the comparison between Example 8 and Comparative Example 6, it was found that the Δk is decreased at almost the same weight average molecular weight only in Example 8 in which the carbon content of the organic silica sol was 12.8 mol %.

4.3.3. $^{29}$Si-DDMAS NMR

FIG. 1 shows the $^{29}$Si-DDMAS NMR results obtained in Example 7 and Comparative Example 3. In FIG. 1, a line indicated by a symbol "a" indicates the results of Example 7, and a line indicated by a symbol "b" indicates the results of Comparative Example 3.

As shown in FIG. 1, while a peak T2 including Si—OH is observed in the spectrum of Comparative Example 3, the peak T2 is decreased in Example 7. As shown in FIG. 1, it was confirmed that a peak T3 of Si—O in the spectrum of Example 7 is greater than the peak T3 of Comparative Example 3. In more detail, while the peak area ratio (T3/T2) is 8.6 in Example 1, the peak area ratio (T3/T2) is 3.1 in Comparative Example 1.

From these results, it was found that, while the condensation reaction did not proceed merely by curing by heating, the condensation reaction sufficiently proceeded in the examples due to a decrease in the amount of component including Si—OH.

As is clear from the above results, it was confirmed that the invention enables formation of an organic silica-based film having significantly improved characteristics, particularly the modulus of elasticity, Δk, and hydrophobicity, in comparison with the comparative examples. Therefore, the organic silica-based film obtained according to the invention exhibits excellent mechanical strength, a low relative dielectric constant, and low hygroscopicity, and can be suitably used as an interlayer dielectric for a semiconductor device and the like.

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention.

What is claimed is:

1. A composition comprising an organic silica sol having a carbon content of 11.8 to 16.7 mol %, and an organic solvent, the organic silica sol being a hydrolysis-condensation product produced by hydrolysis and condensation of one or more silane compounds selected from compounds shown by the following general formulae (1) to (4),

$$R^1Si(OR^2)_3 \quad (1)$$

wherein R$^1$ represents an alkyl group or an aryl group, and R$^2$ represents an alkyl group or an aryl group,

$$Si(OR^3)_4 \quad (2)$$

wherein R$^3$ represents an alkyl group or an aryl group,

$$(R^4)_2Si(OR^5)_2 \quad (3)$$

wherein R$^4$ represents an alkyl group or an aryl group, and R$^5$ represents an alkyl group or an aryl group, and

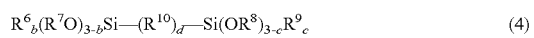

$$R^6{}_b(R^7O)_{3-b}Si—(R^{10})_d—Si(OR^8)_{3-c}R^9{}_c \quad (4)$$

wherein R$^6$ to R$^9$ individually represent an alkyl group or an aryl group, b and c individually represent integers from 0 to 2, R$^{10}$ represents an oxygen atom, a phenylene group, or a group —(CH$_2$)$_m$— (wherein m represents an integer from 1 to 6), and d represents 0 or 1.

2. The composition according to claim 1, wherein the composition comprises one or more silane compounds of formula (1) in an amount of 60 mol % or more.

3. The composition according to claim 1, wherein the composition comprises one or more silane compounds of formula (2) in an amount of 40 mol % or less.

4. The composition according to claim 1, wherein the composition comprises one or more silane compounds of formula (1) in an amount of 65 to 95 mol % and one or more silane compounds of formula (2) in an amount of 5 to 35 mol %.

5. The composition according to claim 1, wherein the composition does not comprise an ultraviolet radiation active reaction promoter.

6. The composition according to claim 5, wherein the ultraviolet radiation active reaction promoter is one or more ultraviolet radiation active reaction promoters selected from the group consisting of a reaction initiator, a sensitizer having a UV absorption function, an acid generator and a base generator.

7. The composition according to claim 1, wherein the content of sodium, potassium and iron in the composition is respectively 100 ppb or less.

8. The composition according to claim 1, wherein the organic silica sol is a hydrolysis-condensation product produced by hydrolysis and condensation of one or more silane compounds selected from the group consisting of methyltrimethoxysilane, methyltriethoxysilane, methyltri-n-propoxysilane, methyltri-iso-propoxysilane, ethyltrimethoxysilane, ethyltriethoxysilane, phenyltrimethoxysilane, and phenyltriethoxysilane.

9. The composition according to claim 1, wherein the organic silica sol is a hydrolysis-condensation product produced by hydrolysis and condensation of one or more silane compounds selected from the group consisting of tetramethoxysilane, tetraethoxysilane, tetra-n-propoxysilane, tetra-iso-propoxysilane, tetra-n-butoxysilane, tetra-sec-butoxysilane, tetra-t-butoxysilane, and tetraphenoxysilane.

10. The composition according to claim 1, wherein the organic silica sol is a hydrolysis-condensation product produced by hydrolysis and condensation of one or more silane compounds selected from the group consisting of dimethyldimethoxysilane, dimethyldiethoxysilane, diethyldimethoxysilane, diethyldiethoxysilane, diphenyldimethoxysilane, and diphenyldiethoxysilane.

11. The composition according to claim 1, wherein the organic silica sol is a hydrolysis-condensation product produced by hydrolysis and condensation of one or more silane compounds selected from the group consisting of hexamethoxydisilane, hexaethoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, and 1,2-diethoxy-1,1,2,2-tetraphenyldisilane.

12. The composition according to claim 1, wherein the organic silica sol is a hydrolysis-condensation product produced by hydrolysis and condensation of one or more silane compounds selected from the group consisting of bis(trimethoxysilyl)methane, bis(triethoxysilyl)methane, 1,2-bis(trimethoxysilyl)ethane, 1,2-bis(triethoxysilyl)ethane, 1-(dimethoxymethylsilyl)-1-(trimethoxysilyl)methane, 1-(diethoxymethylsilyl)-1-(triethoxysilyl)methane, 1-(dimethoxymethylsilyl)-2-(trimethoxysilyl)ethane, 1-(diethoxymethylsilyl)-2-(triethoxysilyl)ethane, bis(dimethoxymethylsilyl)methane, bis(diethoxymethylsilyl)methane, 1,2-bis(dimethoxymethylsilyl)ethane, 1,2-bis(diethoxymethylsilyl)ethane, 1,2-bis(trimethoxysilyl)benzene, 1,2-bis(triethoxysilyl)benzene, 1,3-bis(trimethoxysilyl)benzene, 1,3-bis(triethoxysilyl)benzene, 1,4-bis(trimethoxysilyl)benzene, and 1,4-bis(triethoxysilyl)benzene.

13. An organic silica-based film having a relative dielectric constant of 1.5 to 3.5 and a film density of 0.7 to 1.3 g/cm³, wherein the organic silica-based film is produced by a method comprising:
    applying a composition to a substrate to form a coating;
    heating the coating; and
    applying heat and ultraviolet radiation to the coating to effect a curing treatment,
    wherein the composition comprises an organic silica sol having a carbon content of 11.8 to 16.7 mol %, and an organic solvent,
    the organic silica sol being a hydrolysis-condensation product produced by hydrolysis and condensation of one or more silane compounds selected from compounds shown by the following general formulae (1) to (4),

$$R^1Si(OR^2)_3 \quad (1)$$

wherein $R^1$ represents an alkyl group or an aryl group, and $R^2$ represents an alkyl group or an aryl group,

$$Si(OR^3)_4 \quad (2)$$

wherein $R^3$ represents an alkyl group or an aryl group,

$$(R^4)_2Si(OR^5)_2 \quad (3)$$

wherein $R^4$ represents an alkyl group or an aryl group, and $R^5$ represents an alkyl group or an aryl group, and

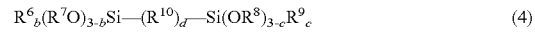

$$R^6{}_b(R^7O)_{3-b}Si-(R^{10})_d-Si(OR^8)_{3-c}R^9{}_c \quad (4)$$

wherein $R^6$ to $R^9$ individually represent an alkyl group or an aryl group, b and c individually represent integers from 0 to 2, $R^{10}$ represents an oxygen atom, a phenylene group, or a group —$(CH_2)_m$— (wherein m represents an integer from 1 to 6), and d represents 0 or 1, and
    wherein the ultraviolet radiation has a wavelength of 250 nm or less.

14. The organic silica-based film according to claim 13, wherein the heat and the ultraviolet radiation are applied at the same time.

15. The organic silica-based film according to claim 13, wherein the heating is performed at 300 to 450° C.

16. The organic silica-based film according to claim 13, wherein the ultraviolet radiation is applied in the absence of oxygen.

17. The organic silica-based film according to claim 13, wherein the coating, after said application of heat and ultraviolet radiation to effect a curing treatment, provides an organic silica-based film having a relative dielectric constant of 1.5 to 3.5 and a film density of 0.7 to 1.3 g/cm³.

18. The organic silica-based film according to claim 13, wherein the composition comprises one or more silane compounds of formula (1) in an amount of 60 mol % or more.

19. The organic silica-based film according to claim 13, wherein the composition comprises one or more silane compounds of formula (2) in an amount of 40 mol % or less.

20. The organic silica-based film according to claim 13, wherein the composition comprises one or more silane compounds of general formula (1) in an amount of 65 to 95 mol % and one or more silane compounds of general formula (2) in an amount of 5 to 35 mol %.

21. The organic silica-based film according to claim 13, wherein the composition does not comprise an ultraviolet radiation active reaction promoter.

22. The organic silica-based film according to claim 13, wherein the content of sodium, potassium, and iron in the composition is respectively 100 ppb or less.

23. The organic silica-based film according to claim 13, wherein the organic silica sol is a hydrolysis-condensation product produced by hydrolysis and condensation of one or more silane compounds selected from the group consisting of methyltrimethoxysilane, methyltriethoxysilane, methyltri-n-propoxysilane, methyltri-iso-propoxysilane, ethyltrimethoxysilane, ethyltriethoxysilane, phenyltrimethoxysilane, and phenyltriethoxysilane.

24. The organic silica-based film according to claim 13, wherein the organic silica sol is a hydrolysis-condensation product produced by hydrolysis and condensation of one or more silane compounds selected from the group consisting of tetramethoxysilane, tetraethoxysilane, tetra-n-propoxysilane, tetra-iso-propoxysilane, tetra-n-butoxysilane, tetra-sec-butoxysilane, tetra-t-butoxysilane, and tetraphenoxysilane.

25. The organic silica-based film according to claim 13, wherein the organic silica sol is a hydrolysis-condensation product produced by hydrolysis and condensation of one or more silane compounds selected from the group consisting of dimethyldimethoxysilane, dimethyldiethoxysilane, diethyldimethoxysilane, diethyldiethoxysilane, diphenyldimethoxysilane, and diphenyldiethoxysilane.

26. The organic silica-based film according to claim 13, wherein the organic silica sol is a hydrolysis-condensation product produced by hydrolysis and condensation of one or more silane compounds selected from the group consisting of hexamethoxydisilane, hexaethoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, and 1,2-diethoxy-1,1,2,2-tetraphenyldisilane.

27. The organic silica-based film according to claim 13, wherein the organic silica sol is a hydrolysis-condensation product produced by hydrolysis and condensation of one or more silane compounds selected from the group consisting of bis(trimethoxysilyl)methane, bis(triethoxysilyl)methane, 1,2-bis(trimethoxysilyl)ethane, 1,2-bis(triethoxysilyl) ethane, 1-(dimethoxymethylsilyl)-1-(trimethoxysilyl)methane, 1-(diethoxymethylsilyl)-1-(triethoxysilyl)methane, 1-(dimethoxymethylsilyl)-2-(trimethoxysilyl)ethane, I-(diethoxymethylsilyl)-2-(triethoxysilyl)ethane, bis (dimethoxymethylsilyl)methane, bis(diethoxymethylsilyl) methane, 1,2-bis(dimethoxymethylsilyl)ethane, 1,2-bis (diethoxymethylsilyl)ethane, 1,2-bis(trimethoxysilyl) benzene, 1,2-bis(triethoxysilyl)benzene, 1,3-bis (trimethoxysilyl)benzene, 1,3-bis(triethoxysilyl)benzene, 1,4-bis(trimethoxysilyl)benzene, and 1,4-bis(triethoxysilyl) benzene.

28. A structure or device comprising the organic silica-based film according to claim 13.

29. An interconnect structure comprising as an interlayer dielectric the organic silica-based film according to claim 13.

30. A semiconductor device comprising the interconnect structure according to claim 29.

* * * * *